(12) United States Patent
Ahn

(10) Patent No.: US 7,316,944 B2
(45) Date of Patent: Jan. 8, 2008

(54) FABRICATING METHOD OF A LIQUID CRYSTAL DISPLAY DEVICE

(75) Inventor: Byung Chul Ahn, Anyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/236,831

(22) Filed: Sep. 28, 2005

(65) Prior Publication Data

US 2006/0017054 A1   Jan. 26, 2006

(51) Int. Cl.
*H01L 21/00* (2006.01)
*H01L 21/84* (2006.01)

(52) U.S. Cl. ................ 438/155; 438/158; 257/E21.414

(58) Field of Classification Search ................ 438/149, 438/155, 158, 238; 257/E21.414
See application file for complete search history.

(56) References Cited

U.S. PATENT DOCUMENTS

| | | | |
|---|---|---|---|
| 5,162,933 A | 11/1992 | Kakuda et al. | |
| 5,317,433 A | 5/1994 | Miyawaki et al. | |
| 5,339,181 A | 8/1994 | Kini et al. | |
| 5,462,887 A | 10/1995 | Gliick | |
| 5,668,379 A | 9/1997 | Ono et al. | |
| 5,731,856 A | 3/1998 | Kim et al. | |
| 5,771,083 A | 6/1998 | Fujihara et al. | |
| 5,793,460 A | 8/1998 | Yang | |
| 5,847,781 A | 12/1998 | Ono et al. | |
| 6,573,532 B2 * | 6/2003 | Park ............................ | 257/59 |
| 6,982,776 B2 * | 1/2006 | Nagano et al. ............. | 349/141 |

* cited by examiner

*Primary Examiner*—Michael Lebentritt
*Assistant Examiner*—Stanetta Isaac
(74) *Attorney, Agent, or Firm*—McKenna Long & Aldridge LLP

(57) ABSTRACT

A horizontal electric field applying type thin film transistor substrate of a LCD device having an increased aperture ratio as well as a simplified manufacturing process. The device includes a gate line having a double layered structure including a transparent first conductive layer and an opaque second conductive layer, a data line crossing the gate line to define a pixel area; a thin film transistor connected to the gate line and the data line; a common line having first and second conductive layers and substantially parallel to the gate line; a common electrode extended from the first conductive layer of the common line in the pixel area; and a pixel electrode connected to the thin film transistor to form a horizontal electric field with the common electrode in the pixel area.

14 Claims, 29 Drawing Sheets

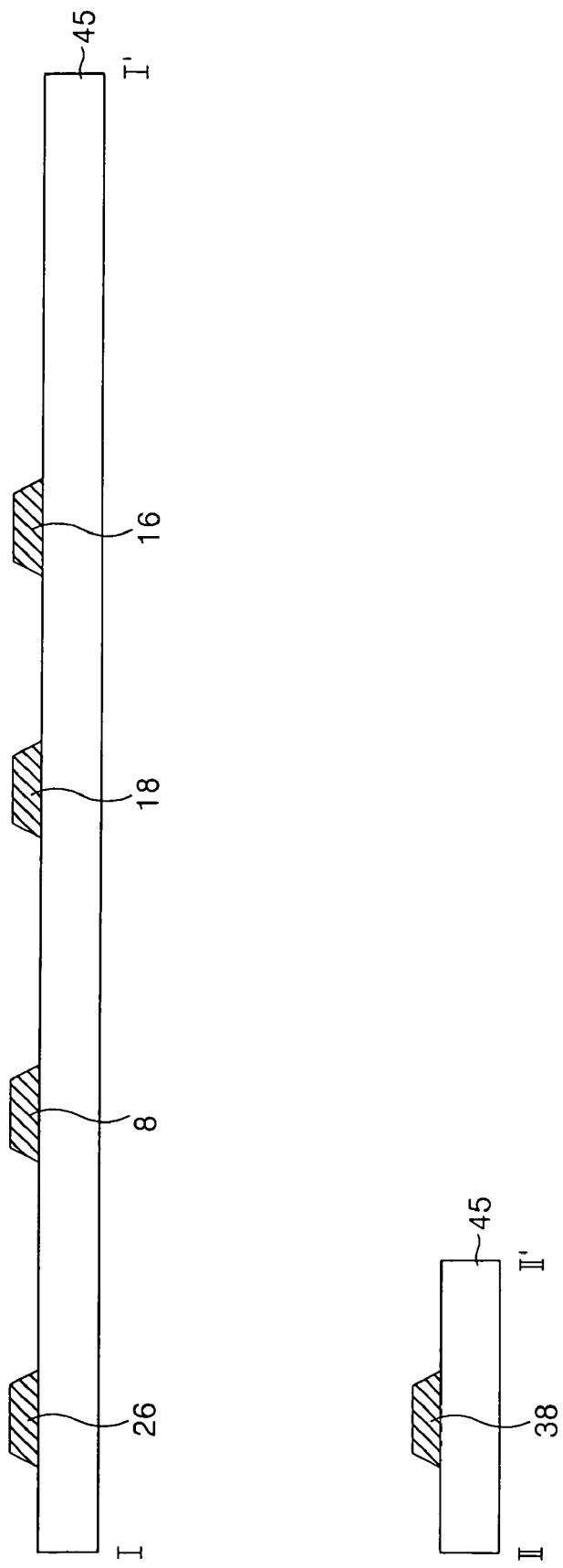

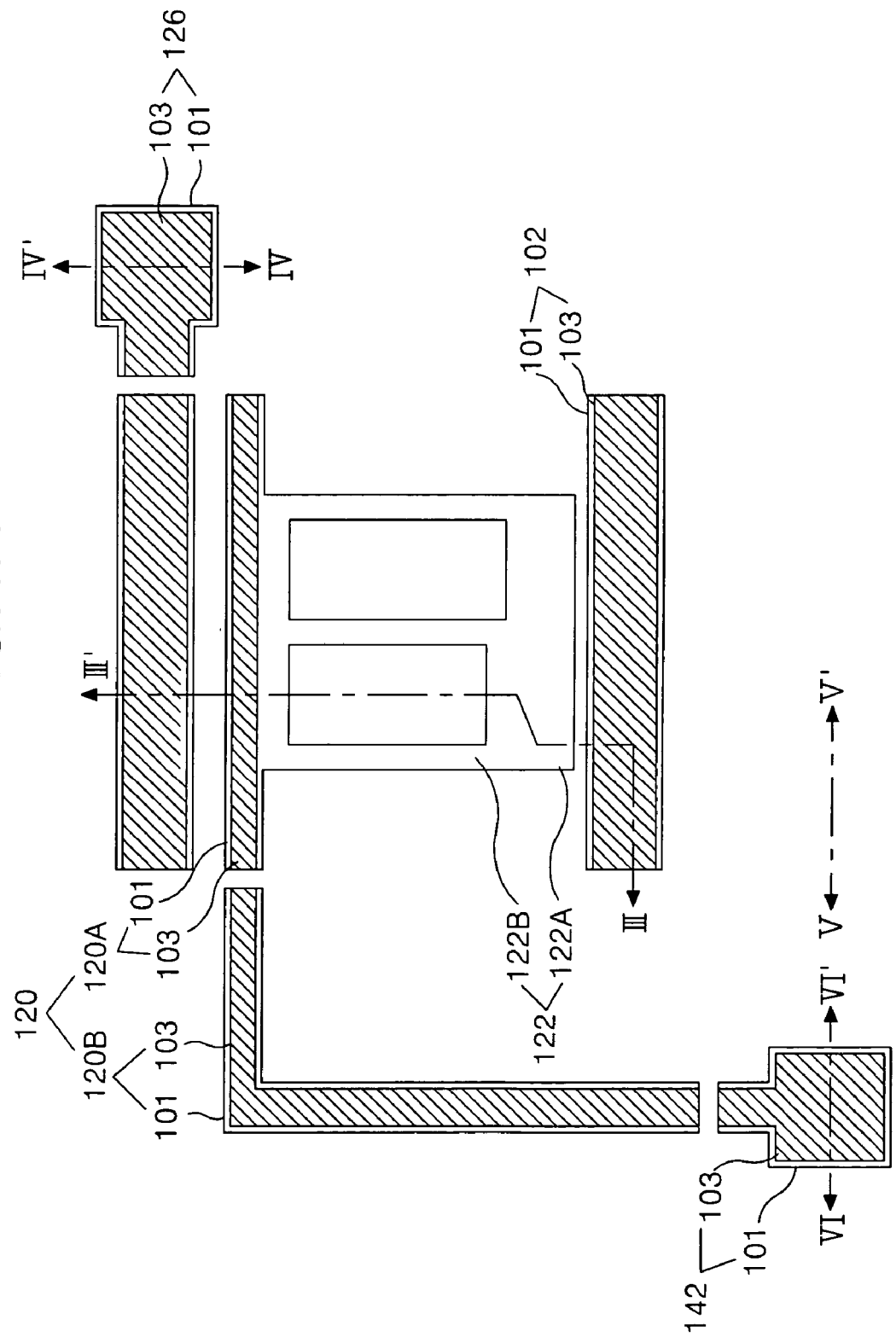

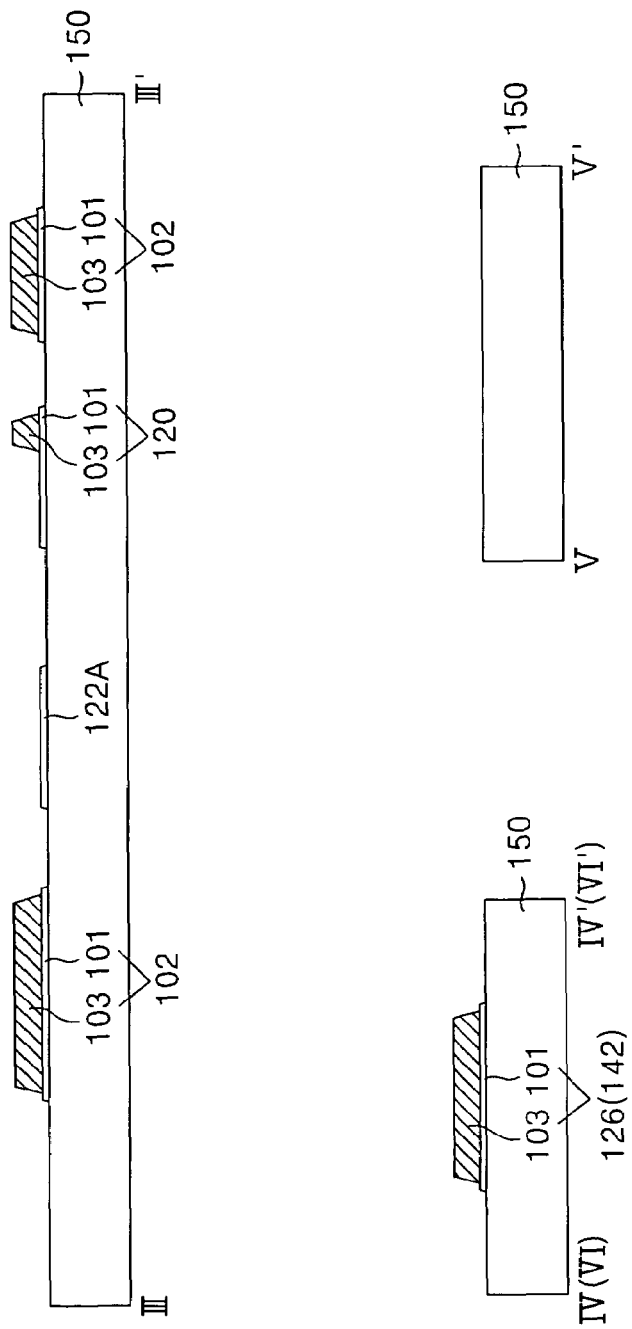

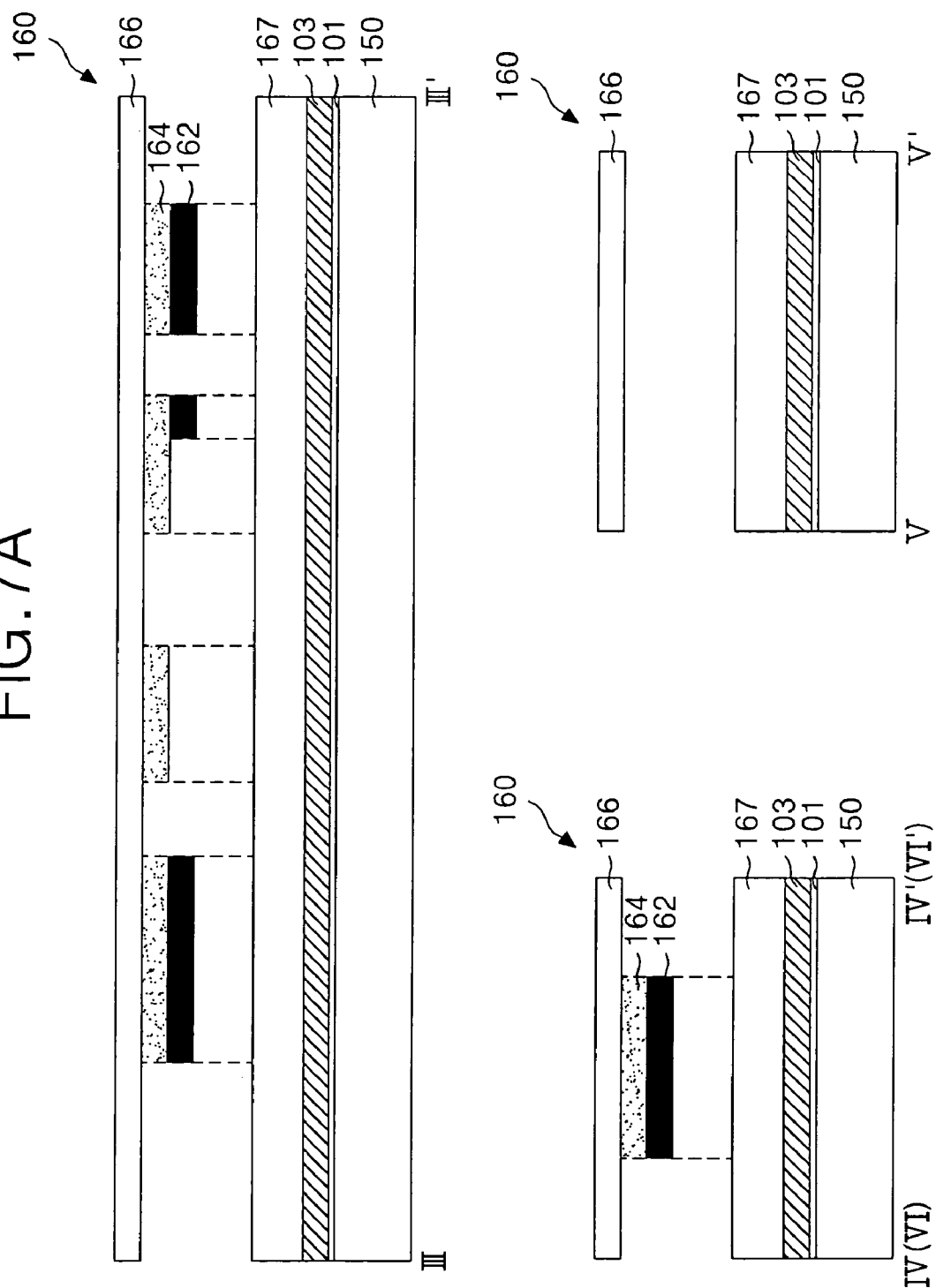

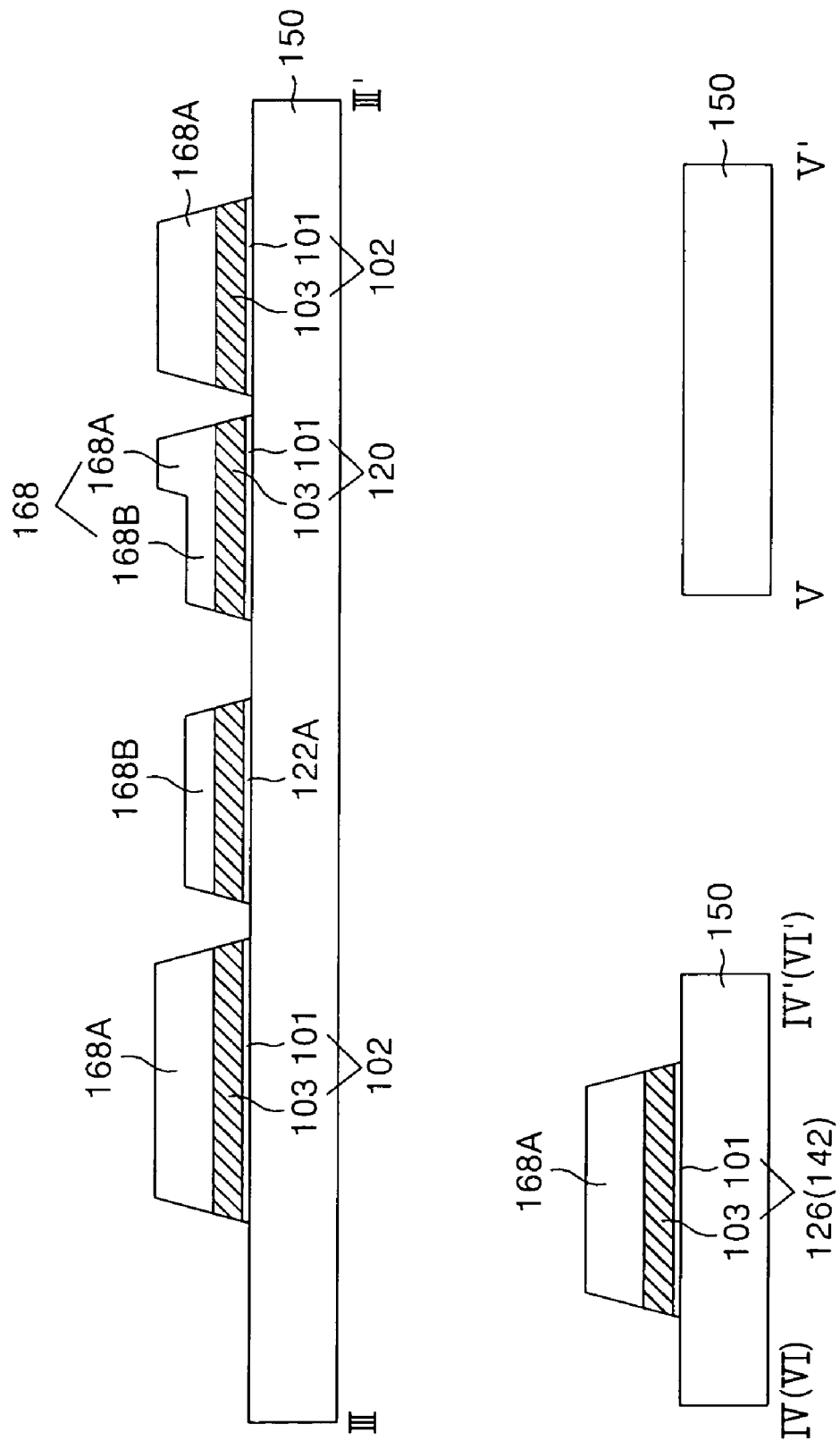

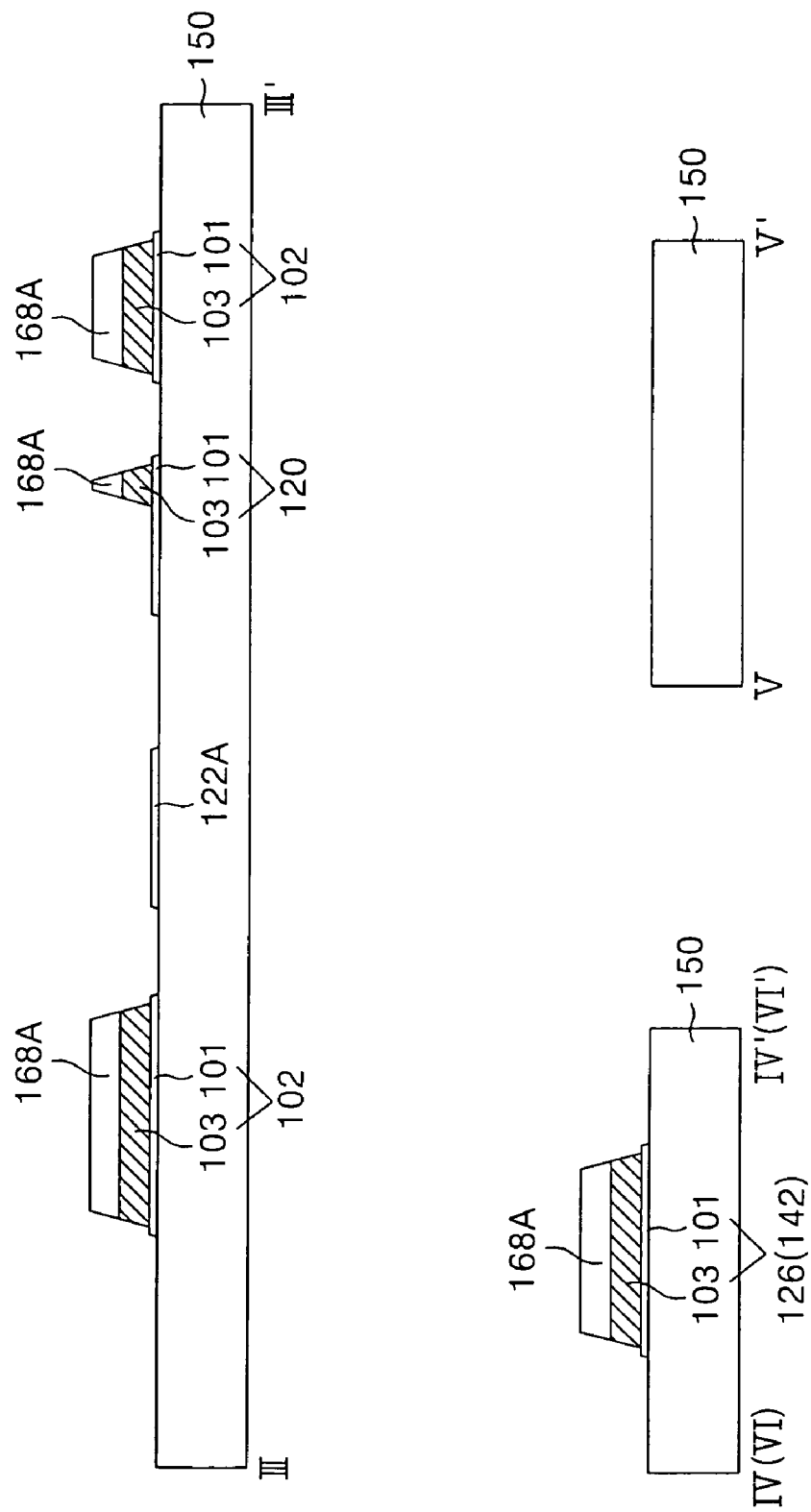

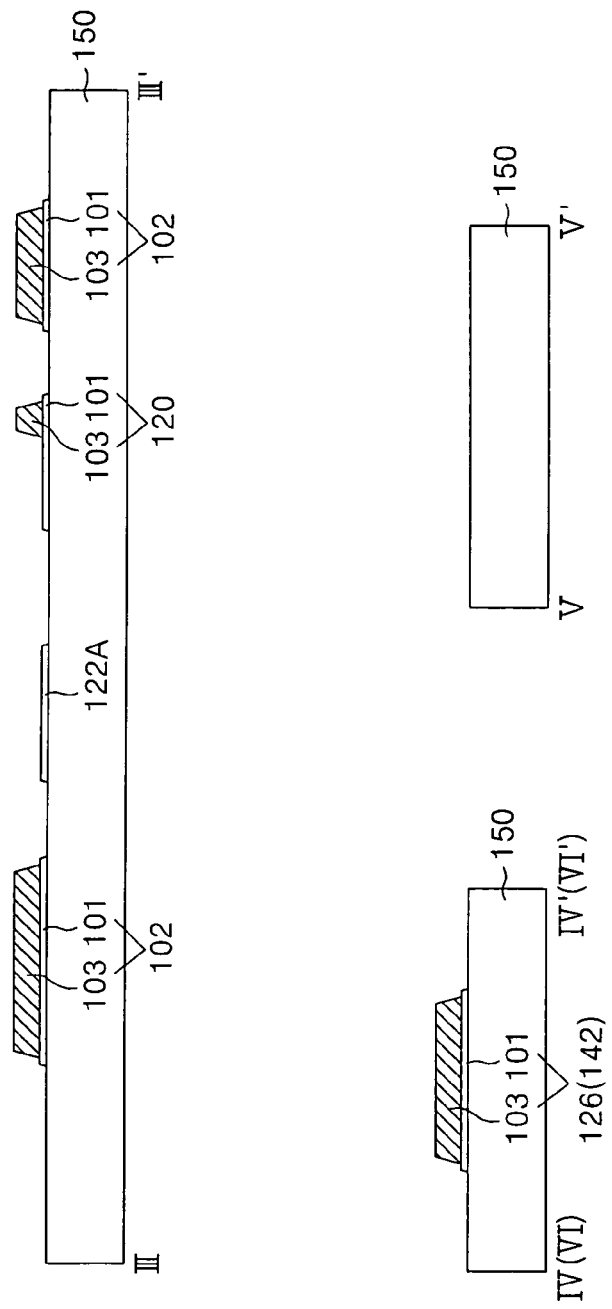

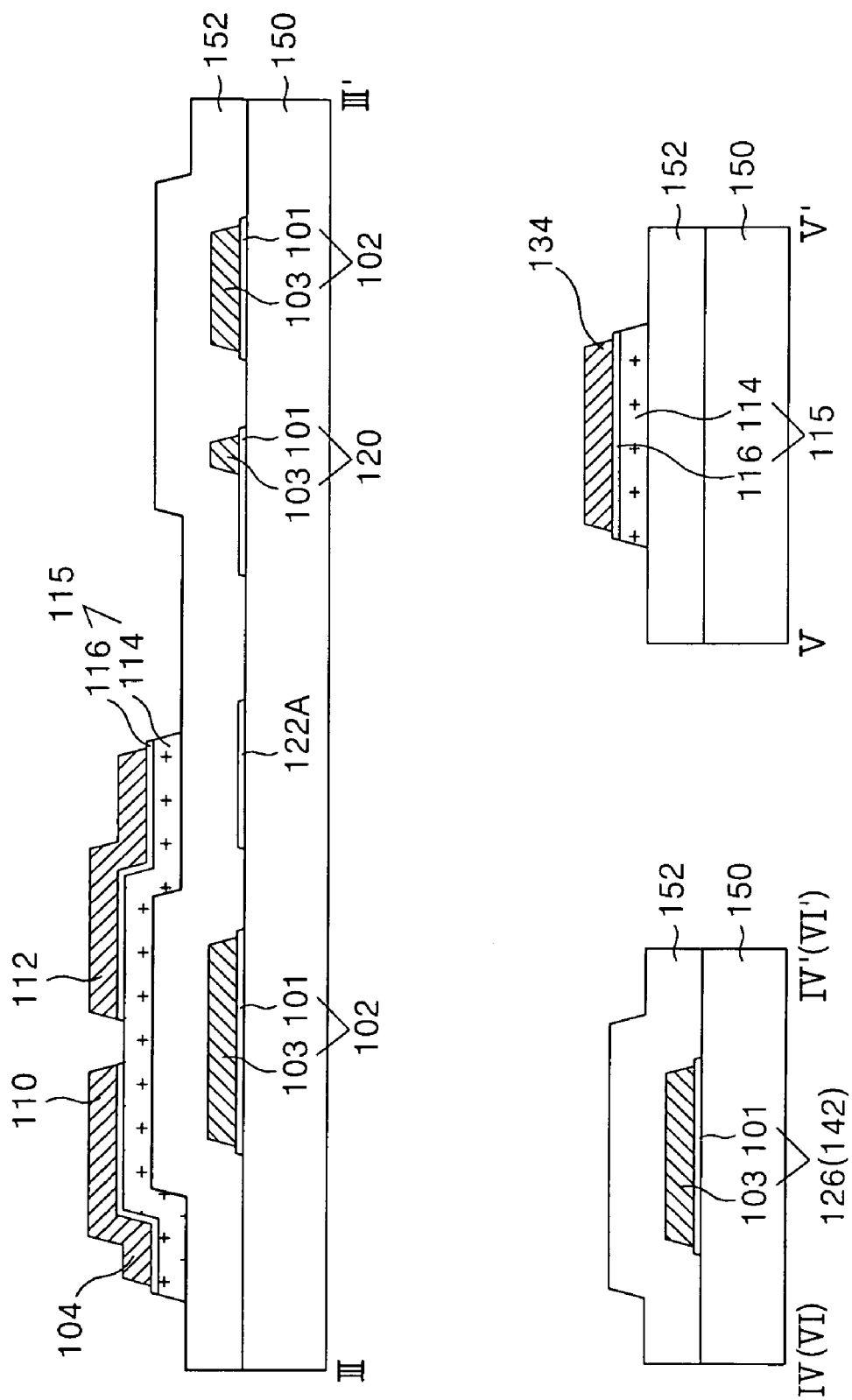

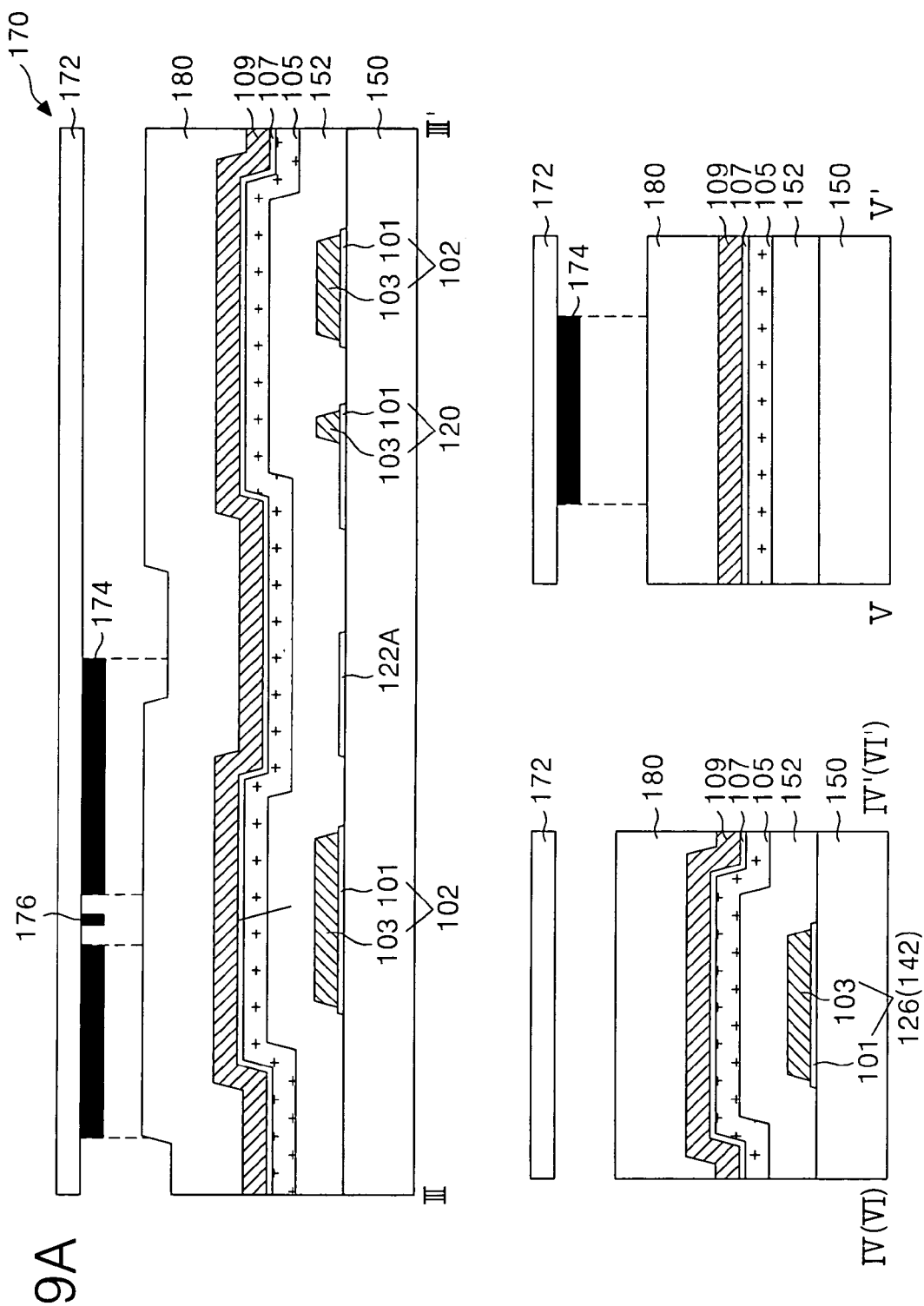

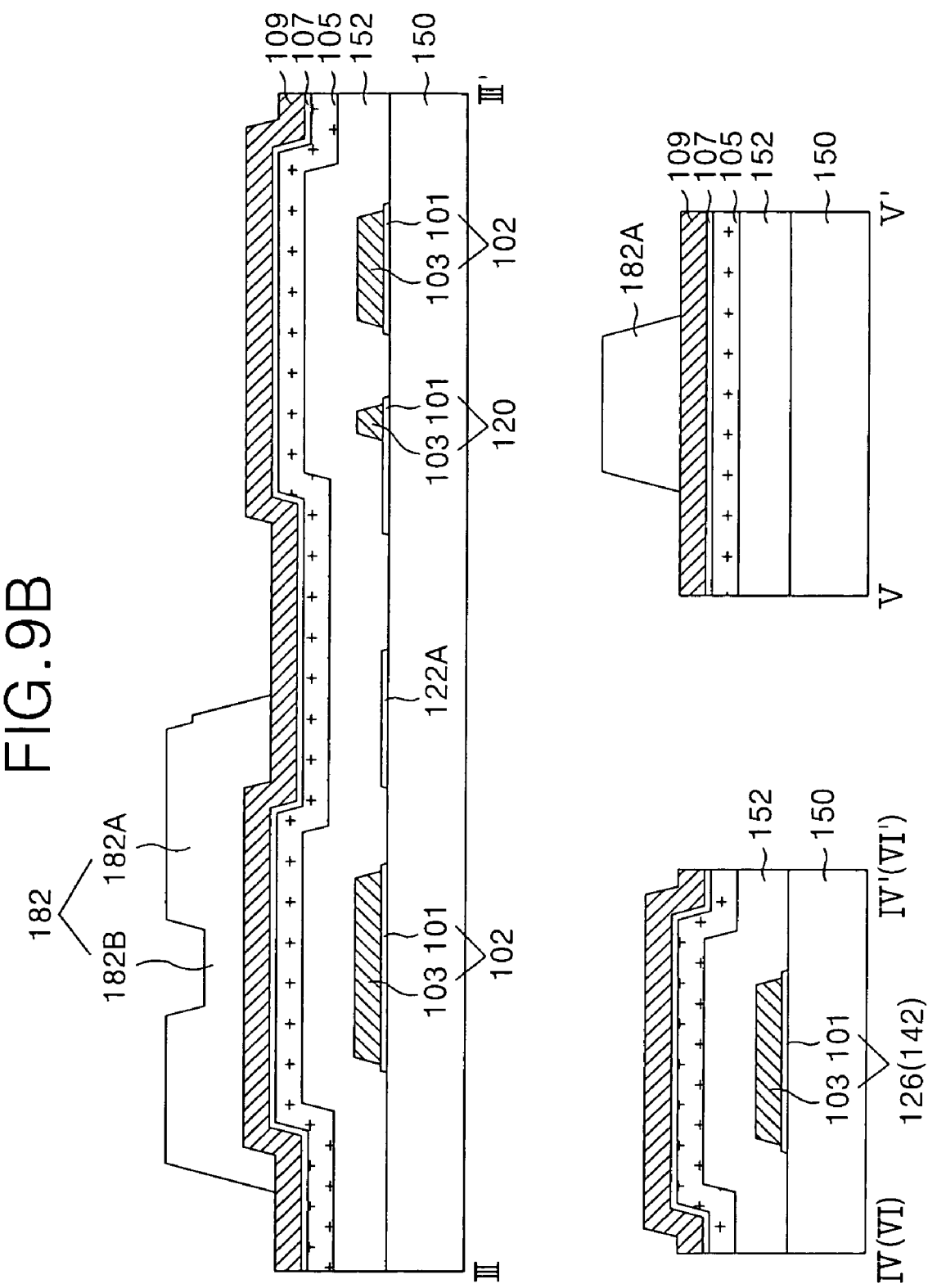

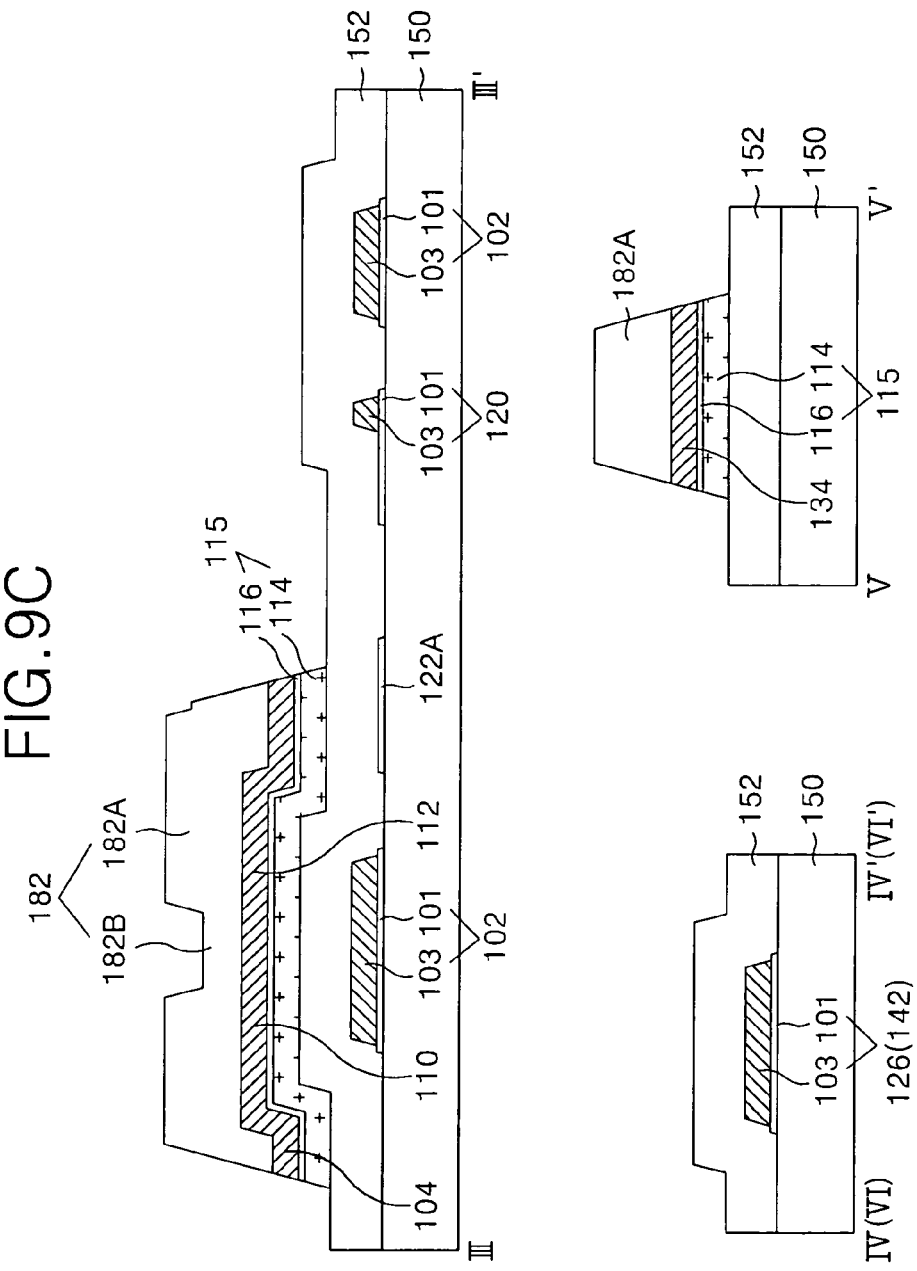

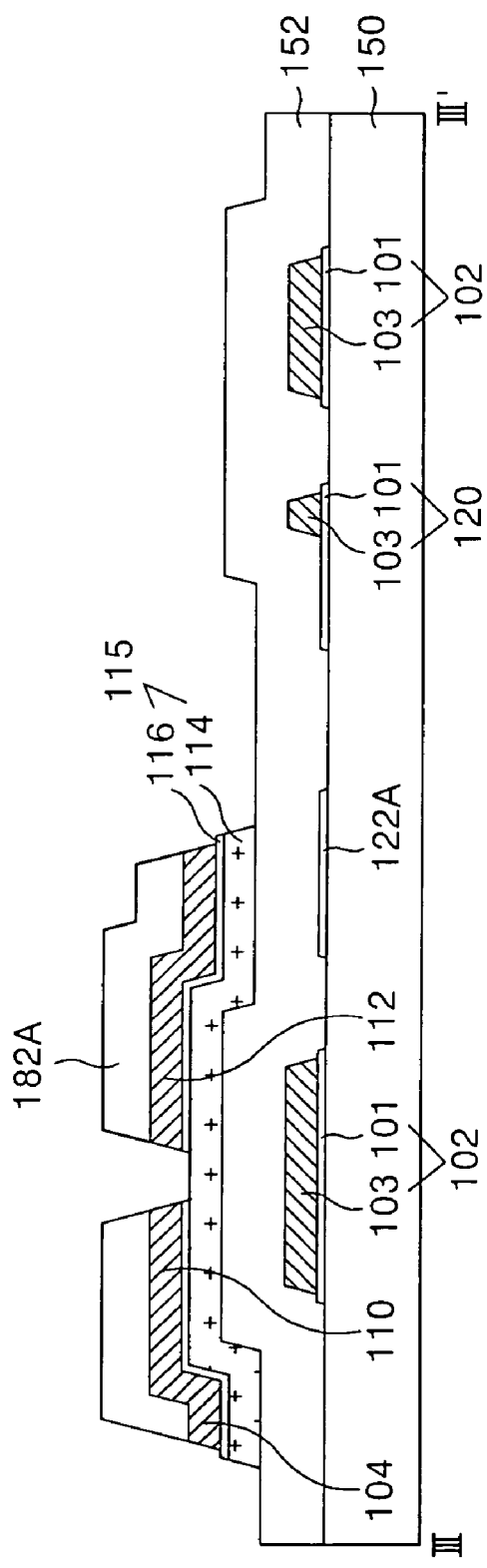
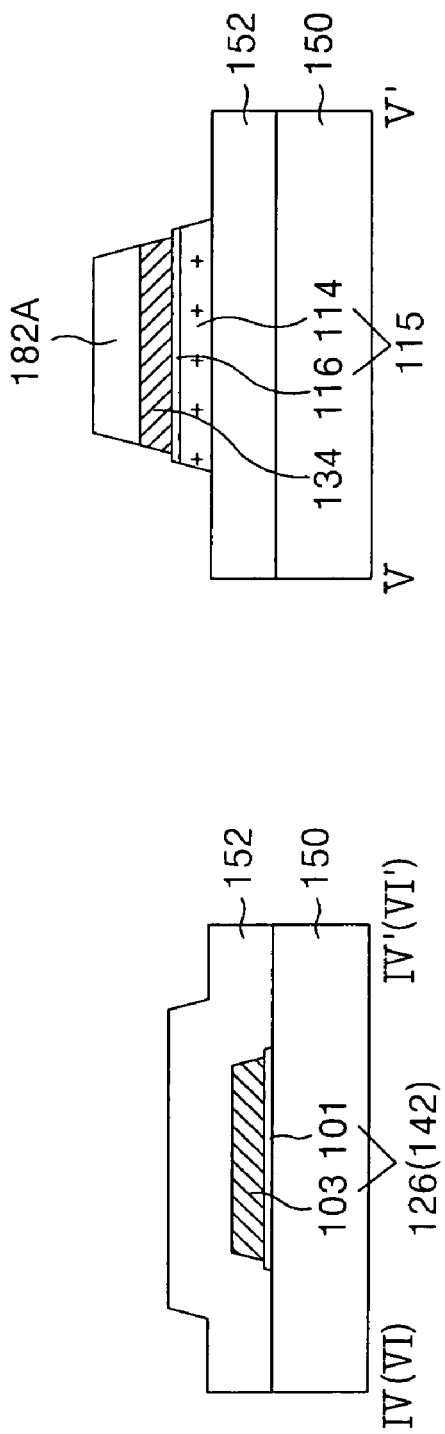
FIG.9D

FIG.9E
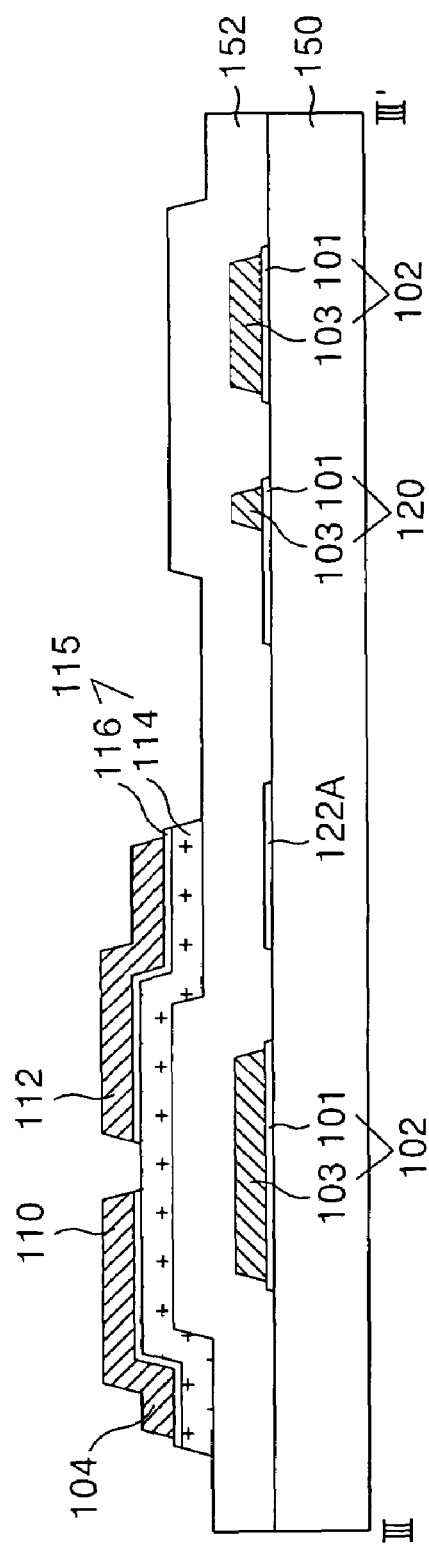
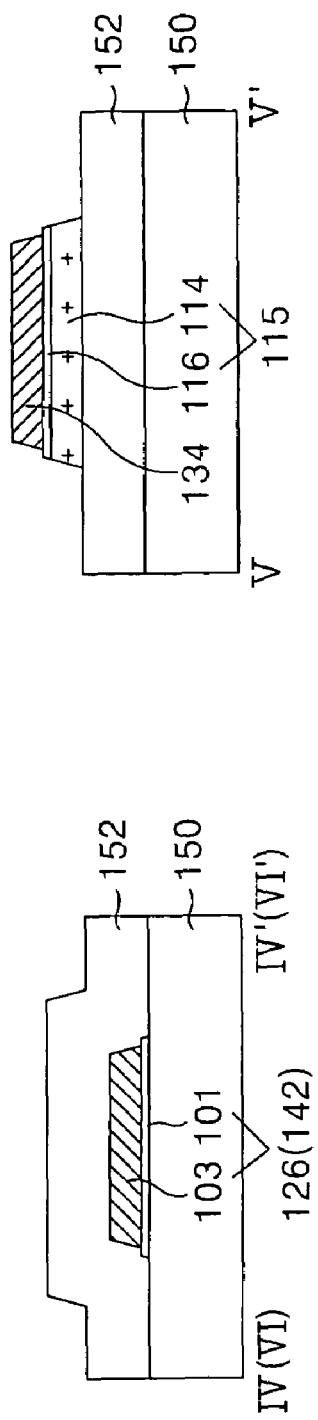

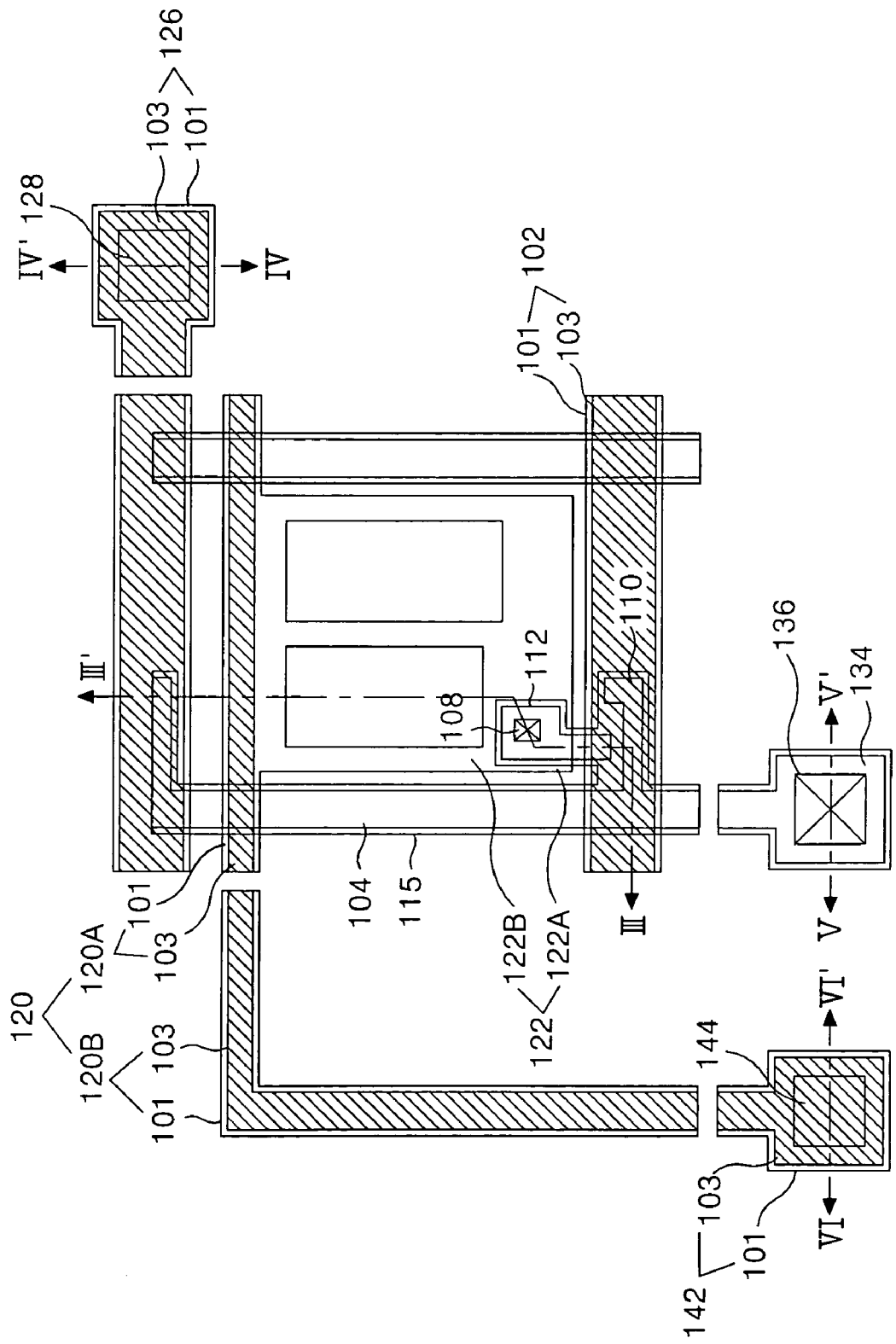

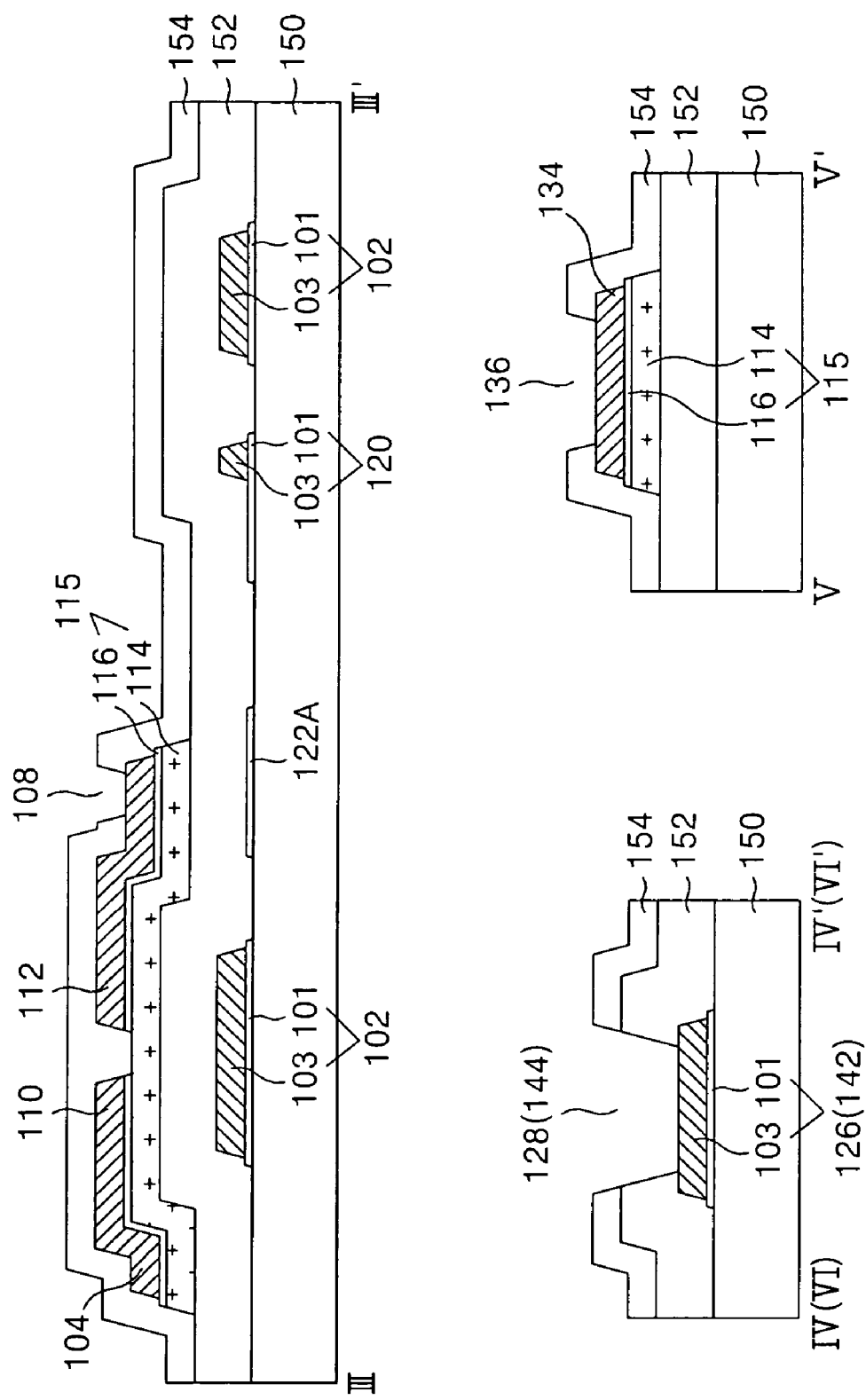

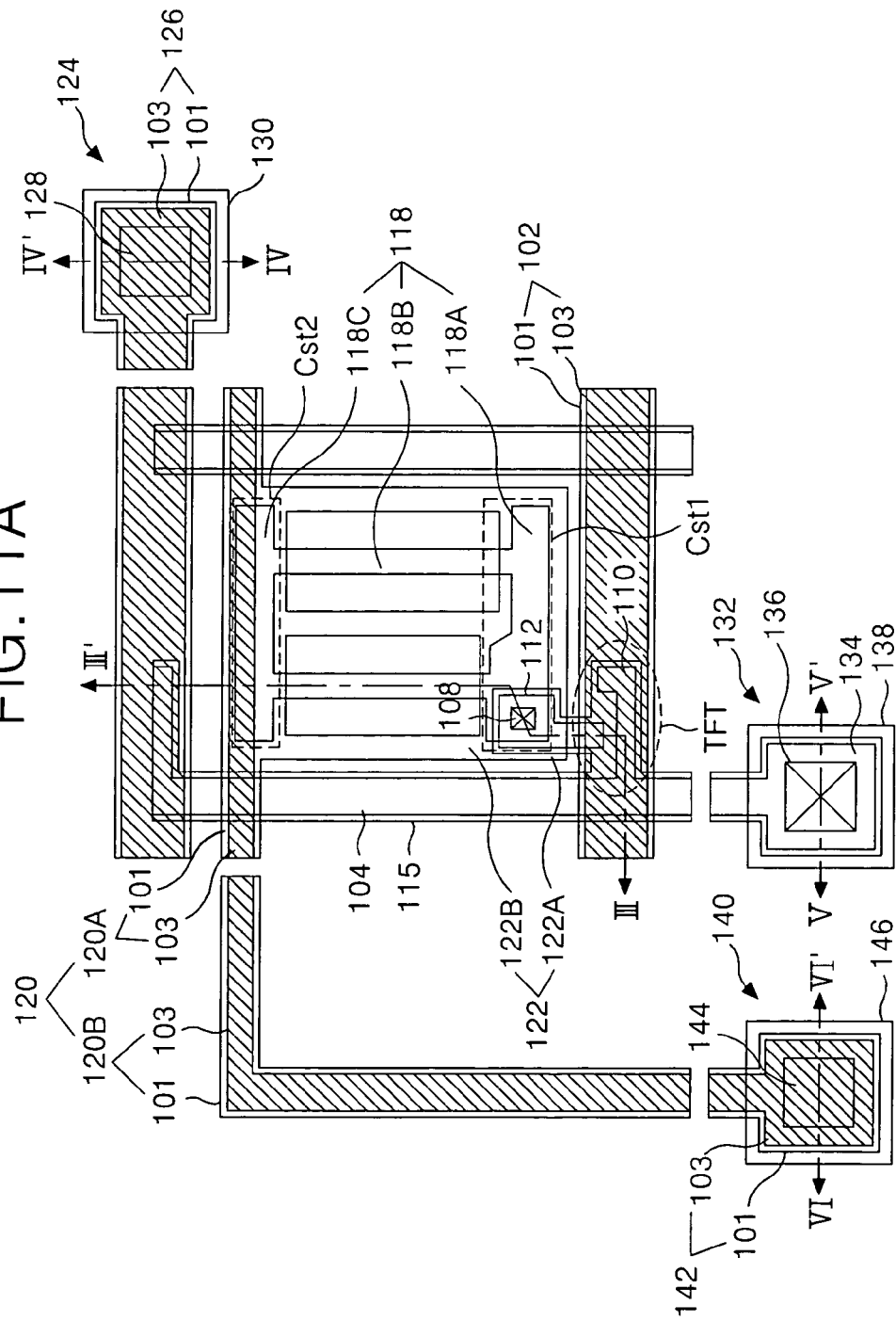

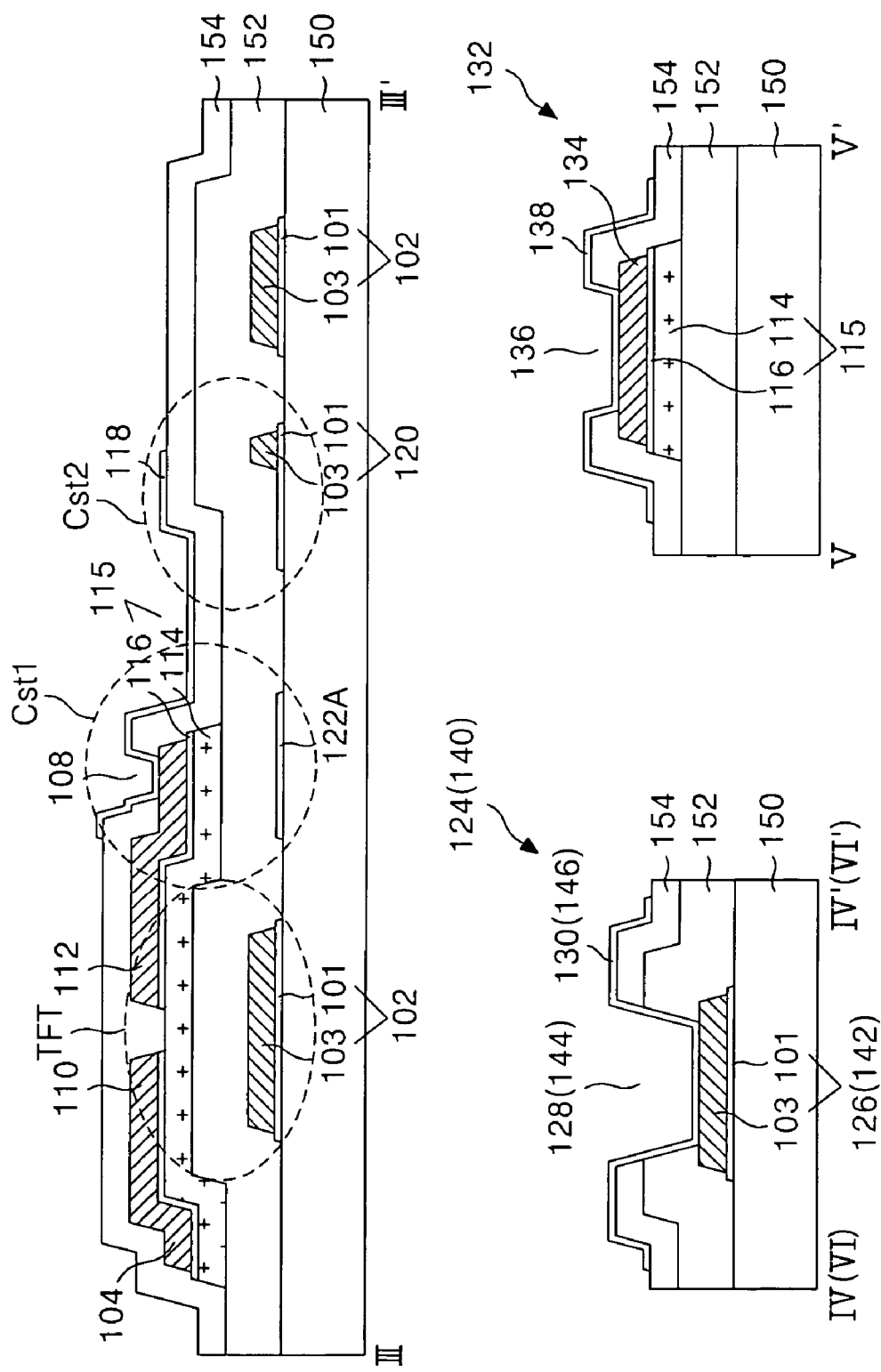

FABRICATING METHOD OF A LIQUID CRYSTAL DISPLAY DEVICE

Korean Patent Application No. P2004-47574, filed on Jun. 24, 2004, is hereby incorporated by reference for all purposes as is fully set forth herein.

BACKGROUND OF THE INVENTION

1. Field of the Invention

The present invention relates to a liquid crystal display device using a horizontal electric field. More particularly, the present invention relates to a horizontal electric field applying type thin film transistor substrate having a simplified process, and a fabricating method thereof.

2. Description of the Related Art

A liquid crystal display device controls the light transmittance of liquid crystal using an electric field, thereby displaying a picture. The liquid crystal display device is divided into two main types: a vertical electric field applying type and a horizontal electric field applying type based upon the direction of an electric field that drives the liquid crystal.

The vertical electric field applying type liquid crystal display device drives a liquid crystal of TN (twisted nematic) mode using a vertical electric field formed between a pixel electrode and a common electrode which are disposed opposite in upper and lower substrates. The vertical electric field applying type liquid crystal display device has an advantage in that its aperture ratio is high, but a disadvantage in that its viewing angle is as narrow as 90°.

The horizontal electric field applying type liquid crystal display device drives a liquid crystal of IPS (in-plane switching) mode using a horizontal electric field which is formed between a pixel electrode and a common electrode disposed in parallel in the lower substrate. The horizontal electric field applying type liquid crystal display device has an advantage in that its viewing angle is as wide as 160°. Hereinafter, the horizontal electric field applying type liquid crystal display device will be described in detail.

The horizontal electric field applying type liquid crystal display device includes a thin film transistor substrate (lower plate) and a color filter substrate (upper plate) which are opposite to each other and bonded together; a spacer maintaining a cell gap between the two substrates; and a liquid crystal filled in the cell gap.

The thin film transistor substrate includes thin film transistors; a plurality of signal wire lines forming a horizontal electric field by pixels; and an alignment film spread thereon for liquid crystal alignment. The color filter substrate includes a color filter for realizing color; a black matrix for preventing light leakage; and an alignment film formed thereon for liquid crystal alignment.

In the liquid crystal display device, the thin film transistor substrate includes a semiconductor process and requires a plurality of mask processes. Thus, its fabricating method is complicated so as to be a major cause of the manufacturing cost increase of the liquid crystal display panel. In order to solve this, the thin film transistor substrate has been developed in a direction of reducing the number of mask processes. This is because one mask process includes many processes like a thin film deposition process, a cleaning process, a photolithography process, an etching process, a photo-resist peeling process, an inspection process and so on. Accordingly, four mask processes have recently been on the rise, wherein the four mask processes are reduced by one mask process from five mask processes which has been a standard mask process of the thin film transistor substrate.

FIG. 1 is a plan view illustrating a horizontal electric field applying type thin film transistor substrate using four mask processes of the related art, and FIG. 2 is a sectional diagram illustrating the thin film transistor substrate shown in FIG. 1, taken along the lines I-I', II-II'.

The thin film transistor substrate shown in FIGS. 1 and 2 includes a gate line 2 and a data line 4 which are formed on a lower substrate 45 to cross each other with a gate insulating film 46 therebetween; a thin film transistor 6 formed at each crossing part; a pixel electrode 14 and a common electrode 18 which are formed to form a horizontal electric field in a pixel area; and a common line 16 connected to the common electrode 18. And, the thin film transistor includes a storage capacitor 20 formed at an overlapping part of the pixel electrode 14 and the common line 16; a gate pad 24 connected to the gate line 2; a data pad 30 connected to the data line 4; and a common pad 36 connected to the common line 16.

The gate line 2 supplying a gate signal and the data line 4 supplying a data signal are formed in a cross structure to define a pixel area.

The common line 16 supplying a reference voltage for driving liquid crystal is formed substantially parallel to the gate line 2 with a pixel area therebetween.

The thin film transistor 6 receives the pixel signal of the data line 4 to be charged and kept in the pixel electrode 14 in response to the gate signal of the gate line 2. The thin film transistor 6 includes a gate electrode 8 connected to the gate line 2; a source electrode 10 connected to the data line 4; a drain electrode 12 connected to the pixel electrode 14; an active layer 48 which overlaps the gate electrode 8 with a gate insulating film 46 therebetween to form a channel between the source electrode 10 and the drain electrode 12; and ah ohmic contact layer 50 for being in ohmic contact with the source and drain electrodes 10, 12 and the active layer 48.

The active layer 48 and the ohmic contact layer 50 are formed to overlap the data line 4, the data pad lower electrode 32, and a storage upper electrode 22.

The pixel electrode 14 is connected to the drain electrode 12 of the thin film transistor 6 through a first contact hole 13 penetrating a passivation film 52. The pixel electrode 14 is connected to the drain electrode 12, and includes a first horizontal part 14A formed parallel to the adjacent gate line 2; a second horizontal part 14B formed to overlap the common line 16; and a finger part 14C formed in perpendicular between the first and second horizontal parts 14A, 14B.

The common electrode 18 is connected to the common line 16 and formed at a pixel area. The common electrode 18 is formed parallel to the finger part 14C of the pixel electrode 14 in the pixel area 5.

Accordingly, a horizontal electric field is formed between the pixel electrode 14 to which a pixel signal is supplied through the thin film transistor 6 and the common electrode 18 to which a reference voltage (hereinafter, referred to as "common voltage") is supplied through the common line 16. Specifically, the horizontal electric field is formed between the common electrode 18 and the finger part 14C of the pixel electrode 14. The liquid crystal molecules, which are arranged in a horizontal direction between the thin film transistor substrate and the color filter substrate by such a horizontal electric field, rotate by dielectric anisotropy. And, the transmittance of the light transmitted through the pixel area is changed in accordance with the extent of rotation of the liquid crystal molecules, thereby realizing a gray level.

The storage capacitor 20 includes the common line 16 and the storage upper electrode 22 which overlap the common line 16 with the gate insulating film 46, the active layer 48 and the ohmic contact layer 50 and is connected to the pixel electrode 14 through a second contact hole 21 that is formed in the passivation film 50. The storage capacitor 20 is made to stably keep the pixel signal charged in the pixel electrode until the next pixel signal is charged.

The gate line 2 is connected to a gate driver (not shown) through the gate pad 24. The gate pad 24 includes a gate pad lower electrode 26 extended from the gate line 2; and a gate pad upper electrode 28 connected to the gate pad lower electrode 26 through a third contact hole 27 penetrating the gate insulating film 46 and the passivation film 52.

The data line 4 is connected to a data driver (not shown) through the data pad 30. The data pad 30 includes a data pad lower electrode 32 extended from the data line 4; and a data pad upper electrode 34 connected to the data pad lower electrode 32 through a fourth contact hole penetrating the passivation film 52.

The common line 16 receives a common voltage from an external common voltage source (not shown) through the common pad 36. The common pad 36 includes a common pad lower electrode 38 extended from the common line 16; and a common pad upper electrode 40 connected to the common pad lower electrode 38 through a fifth contact hole 39 penetrating the gate insulating film and the passivation film 52.

A fabricating method of the thin film transistor substrate having such a configuration is described in detail by use of four mask processes as shown in FIGS. 3A to 3d.

Referring to FIG. 3A, a gate metal pattern inclusive of the gate line 2, the gate electrode 8, the gate pad lower electrode 26, the common line 16, the common electrode 18 and the common pad lower electrode 38 is formed on the lower substrate 45 by use of a first mask process.

To describe in detail, a gate metal layer is formed on the lower substrate 45 by a deposition method such as sputtering. Subsequently, the gate metal layer is patterned by a photolithography process and an etching process using a first mask, thereby forming the gate metal pattern inclusive of the gate line 2, the gate electrode 8, the gate pad lower electrode 26, the common line 16, the common electrode 18 and the common pad lower electrode 38. The gate metal layer is formed of metal of Al, Mo, Cr in a single or double layer structure.

Referring to FIG. 3B, the gate insulating film 46 is spread on the lower substrate 45 where the gate metal pattern is formed. And there are formed a semiconductor pattern inclusive of the active layer 48 and the ohmic contact layer 50; and a source/drain metal pattern inclusive of the data line 4, the source electrode 10, the drain electrode 12; the data pad lower electrode 32 and the storage upper electrode 22.

To describe in detail, the gate insulating film 46, an amorphous silicon layer, n+ amorphous silicon layer and the source/drain metal layer are sequentially formed by a deposition method such as PECVD, sputtering on the lower substrate 45 where the gate metal pattern is formed. Herein, the material of the gate insulating film 46 is mainly an inorganic insulating material such as SiOx, SiNx and so on. The source/drain metal layer is formed of metal of Al, Mo, Cr system in a single or double layer structure. And then, a photo-resist pattern having a stepped difference is formed on the source/drain metal layer by the photolithography process using a second mask. The source/drain metal layer is patterned by use of the photo-resist pattern having the stepped difference, thereby forming the source/drain metal pattern inclusive of the data line 4, the source electrode 10, the drain electrode integrated with the source electrode 10, and the storage upper electrode 22. And, the n+ amorphous silicon layer and the amorphous silicon layer are simultaneously patterned by a dry etching process using the same photo-resist pattern, thereby forming the ohmic contact layer 50 and the active layer 48. Subsequently, the source/drain metal pattern exposed by ashing the photo-resist pattern is etched along with the ohmic contact layer 50, thereby separating the source electrode 10 and the drain electrode 12.

And then, the photo-resist pattern remaining on the source/drain metal pattern is removed by a stripping process.

Referring to FIG. 3C, the passivation film 52 inclusive of the first to fifth contact holes 13, 21, 27, 33, 39 is formed by a third mask process on the gate insulating film 46 where the source/drain metal pattern is formed.

To describe in detail, the passivation film 52 is formed by the deposition method such as PECVD on the entire surface of the gate insulating film 46 where the source/drain metal pattern is formed. Subsequently, the passivation film 52 is patterned by the photolithography process and the etching process using a third mask, thereby forming the first to fifth contact holes 13, 21, 27, 33, 39. The first contact hole 13 exposes the drain electrode 12 by penetrating the passivation film 52, and the second contact hole 21 exposes the storage upper electrode 22 by penetrating the passivation film 52. The third contact hole 27 exposes the gate pad lower electrode 26 by penetrating the passivation film 52 and the gate insulating film 46, and the fourth contact hole 33 exposes the data pad lower electrode 32 by penetrating the passivation film 52. The fifth contact hole 39 exposes the common pad lower electrode 38 by penetrating the passivation film 52 and the gate insulating film 46.

Herein, the material of the passivation film 52 is an inorganic insulating material like the gate insulating film 46, or an organic insulating material such as BCB, PFCB or acrylic organic compound with low dielectric constant.

Referring to FIG. 3D, a transparent conductive pattern inclusive of the pixel electrode 14, the gate pad upper electrode 28, the data pad upper electrode 34 and the common pad upper electrode 40 is formed on the passivation film 54 by use of a fourth mask process.

To describe in detail, a transparent conductive film is spread on the passivation film 52. Subsequently, the transparent conductive film is patterned by the photolithography process and the etching process using a fourth mask, thereby forming a transparent conductive pattern inclusive of the pixel electrode 14, the gate pad upper electrode 28, the data pad upper electrode 34 and the common pad upper electrode 40. The pixel electrode 14 is connected to the drain electrode 12 that is exposed through the first contact hole 13, and is connected to the storage upper electrode 22 that is exposed through the second contact hole 21. The gate pad upper electrode 28 is connected to the gate pad lower electrode 26 that is exposed through the third contact hole 27. The data pad upper electrode 34 is connected to the data lower electrode 32 that is exposed through the fourth contact hole 33. The common pad upper electrode 40 is connected to the common pad lower electrode 38 that is exposed through the fifth contact hole 39.

Herein, the material of the transparent conductive film is ITO (indium tin oxide).

In this way, the related art horizontal electric field applying type thin film transistor substrate and the fabricating method thereof reduces the number of processes to four mask processes, thereby reducing the manufacturing cost proportionally thereto.

However, the common electrode 18 formed in the pixel area is formed of an opaque gate metal. Thus, there is a problem in that the aperture ratio is low.

Further, due to the aperture ratio problem, there is a limit in increasing the overlapping area of the storage upper electrode 22 and the common line 16 formed of the opaque metal. Thus, there is a problem in that the capacity of the storage capacitor 20 is low.

SUMMARY OF THE INVENTION

Accordingly, the present invention is directed to a liquid crystal display device and fabricating method thereof that substantially obviates one or more of the problems due to limitations and disadvantages of the related art.

An advantage of the present invention is to provide a horizontal electric field applying type thin film transistor substrate for increasing an aperture ratio as well as simplifying its process, and a fabricating method thereof.

Another advantage of the present invention is to provide a horizontal electric field applying type thin film transistor substrate for increasing the capacity of a storage capacitor without reducing the aperture ratio, and a fabricating method thereof.

To achieve these and other advantages of the invention, a liquid crystal display device according to an aspect of the present invention includes a gate line having a double layered structure including a transparent first conductive layer and an opaque second conductive layer; a data line crossing the gate line to define a pixel area; a thin film transistor connected to the gate line and the data line; a common line having first and second conductive layers and substantially parallel to the gate line; a common electrode extended from the first conductive layer of the common line in the pixel area; and a pixel electrode connected to the thin film transistor to form a horizontal electric field with the common electrode in the pixel area.

In another embodiment, a fabricating method of a liquid crystal display device includes: forming a gate pattern having a double layered structure including a transparent first conductive layer and an opaque second conductive layer deposited on a substrate, and a common pattern having a common line of the double layered structure and a common electrode formed of the first conductive layer using a first mask; forming a gate insulating film on the gate pattern and the common pattern; forming a semiconductor pattern on the gate insulating film, and a source/drain pattern having a data line, a source electrode and a drain electrode on the semiconductor pattern using a second mask; forming a passivation film on the source/drain pattern, and a contact hole exposing the drain electrode using a third mask; and forming a pixel electrode connected to the drain electrode through the contact hole using a fourth mask, wherein a horizontal electric field is formed with the common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 3A to 3D are sectional diagrams illustrating a fabricating method of the thin film transistor substrate shown in FIG. 2;

FIGS. 6A and 6B are a plan view and a sectional diagram for explaining a first mask process in a fabricating method of the thin film transistor substrate according to the embodiment of the present invention;

FIGS. 7A to 7E are sectional diagrams for specifically explaining the first mask process of the present invention;

FIGS. 8A and 8B a plan view and a sectional diagram for explaining a second mask process in the fabricating method of the thin film transistor substrate according to the embodiment of the present invention;

FIGS. 9A to 9E are sectional diagrams for specifically explaining the second mask process of the present invention;

FIGS. 10A and 10B are a plan view and a sectional diagram for explaining a third mask process in the fabricating method of the thin film transistor substrate according to the embodiment of the present invention;

FIGS. 11A and 11B are a plan view and a sectional diagram for explaining a fourth mask process in the fabricating method of the thin film transistor substrate according to the embodiment of the present invention;

DETAILED DESCRIPTION OF THE ILLUSTRATED EMBODIMENTS

Reference will now be made in detail to the embodiments of the present invention, examples of which are illustrated in the accompanying drawings.

With reference to FIGS. 4 to 12, embodiments of the present invention will be explained as follows.

Figure 1:
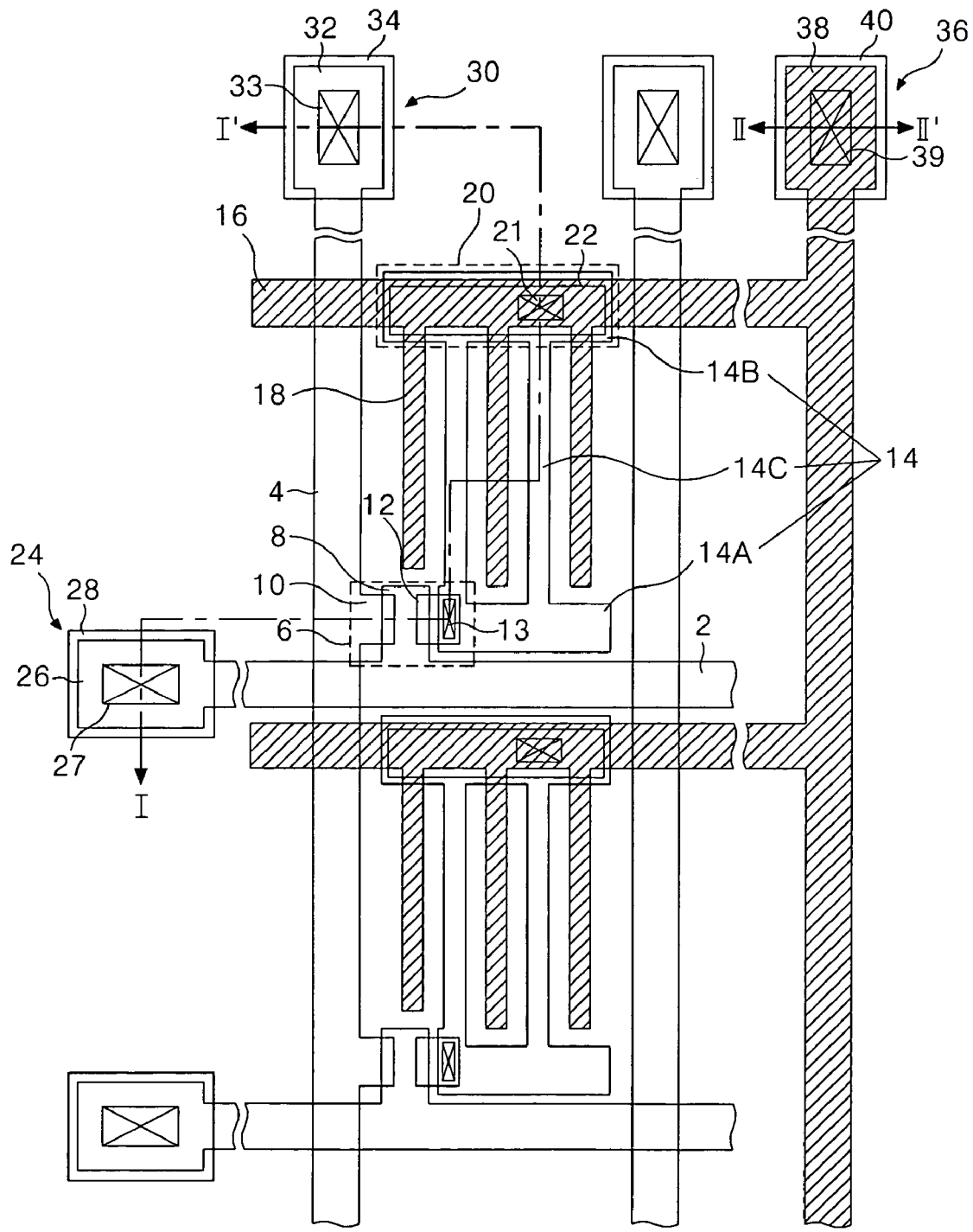
FIG. 1 is a plan view illustrating a horizontal electric field applying type thin film transistor substrate of the related art.
Figure 2:
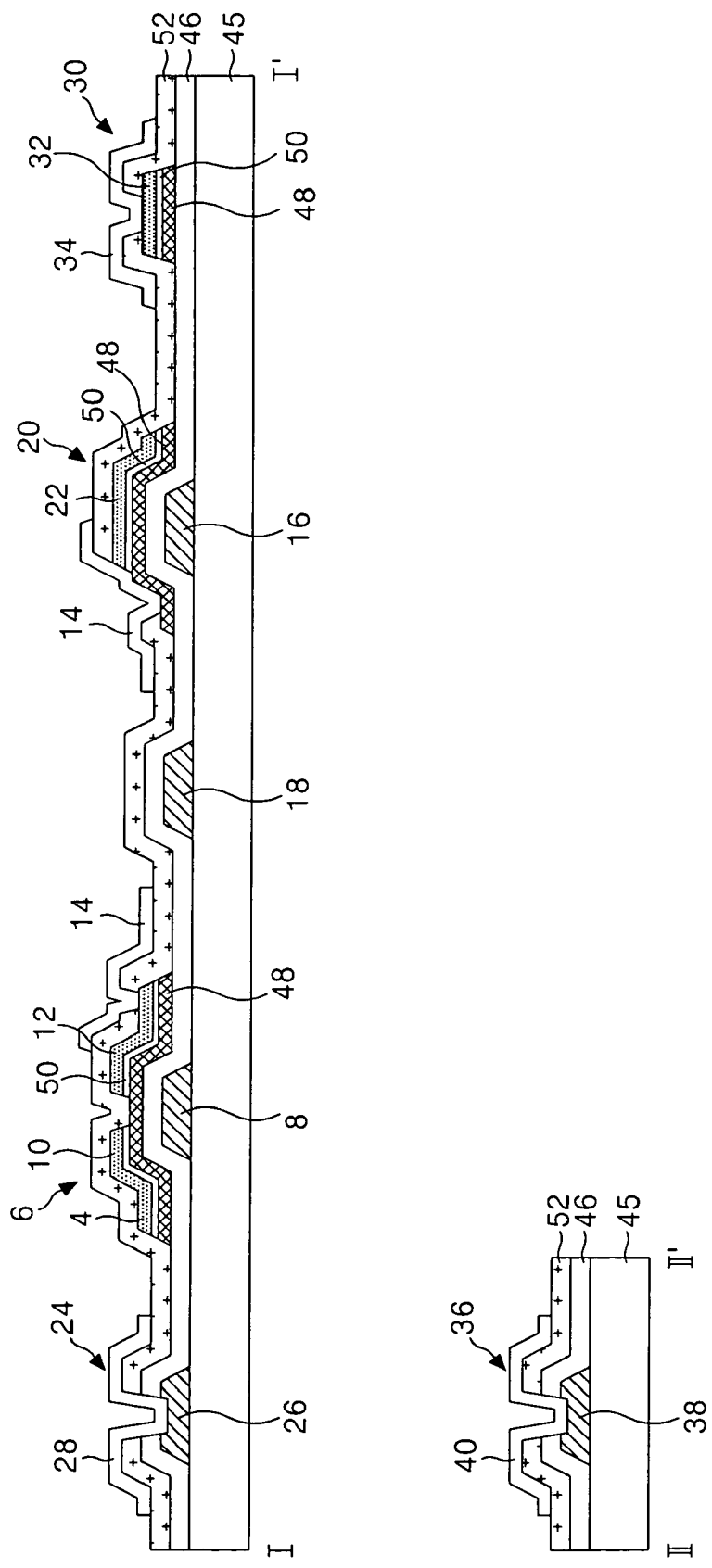
FIG. 2 is a sectional diagram illustrating the thin film transistor substrate shown in FIG. 1, taken along the lines I-I', II-II'.
Figure 3B:
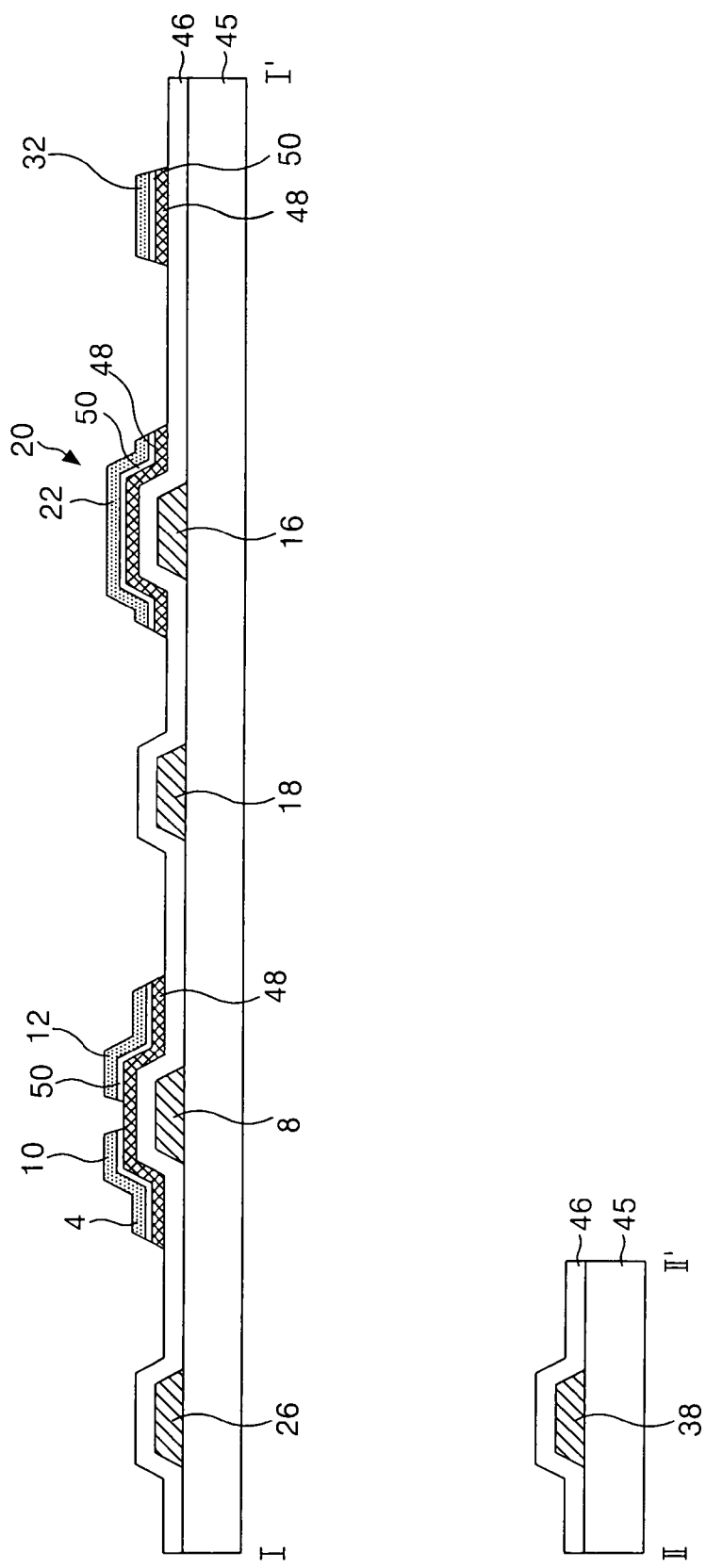
Figure 3C:
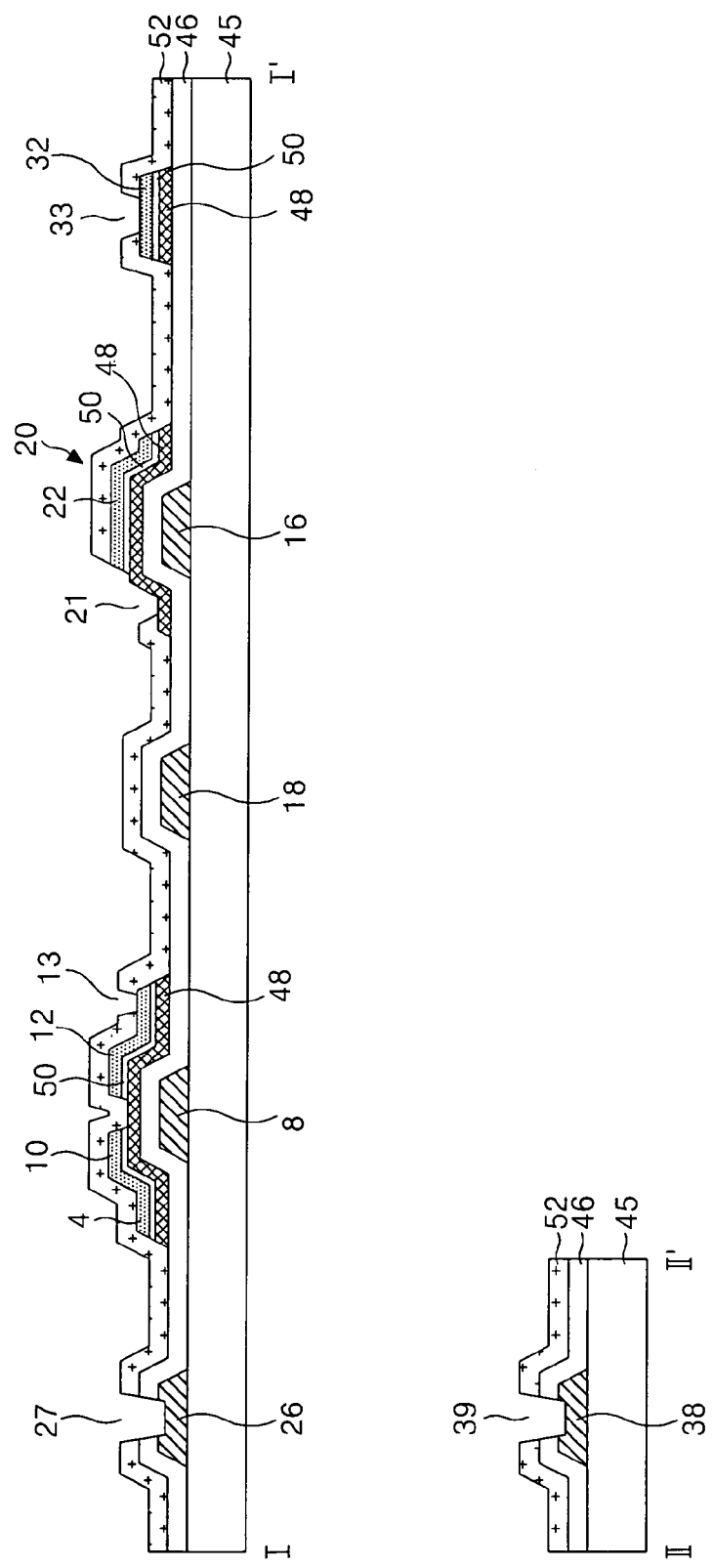
Figure 3D:
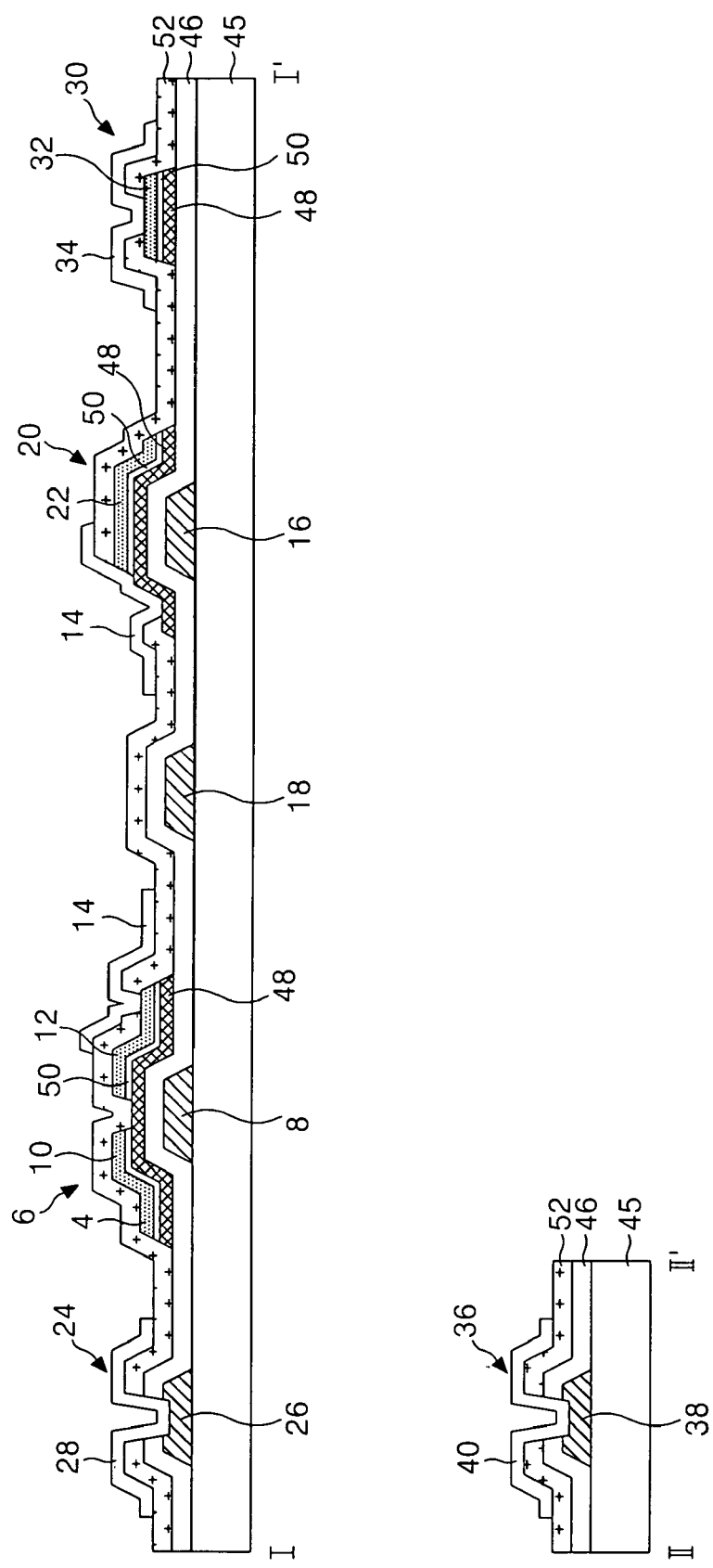
Figure 4:
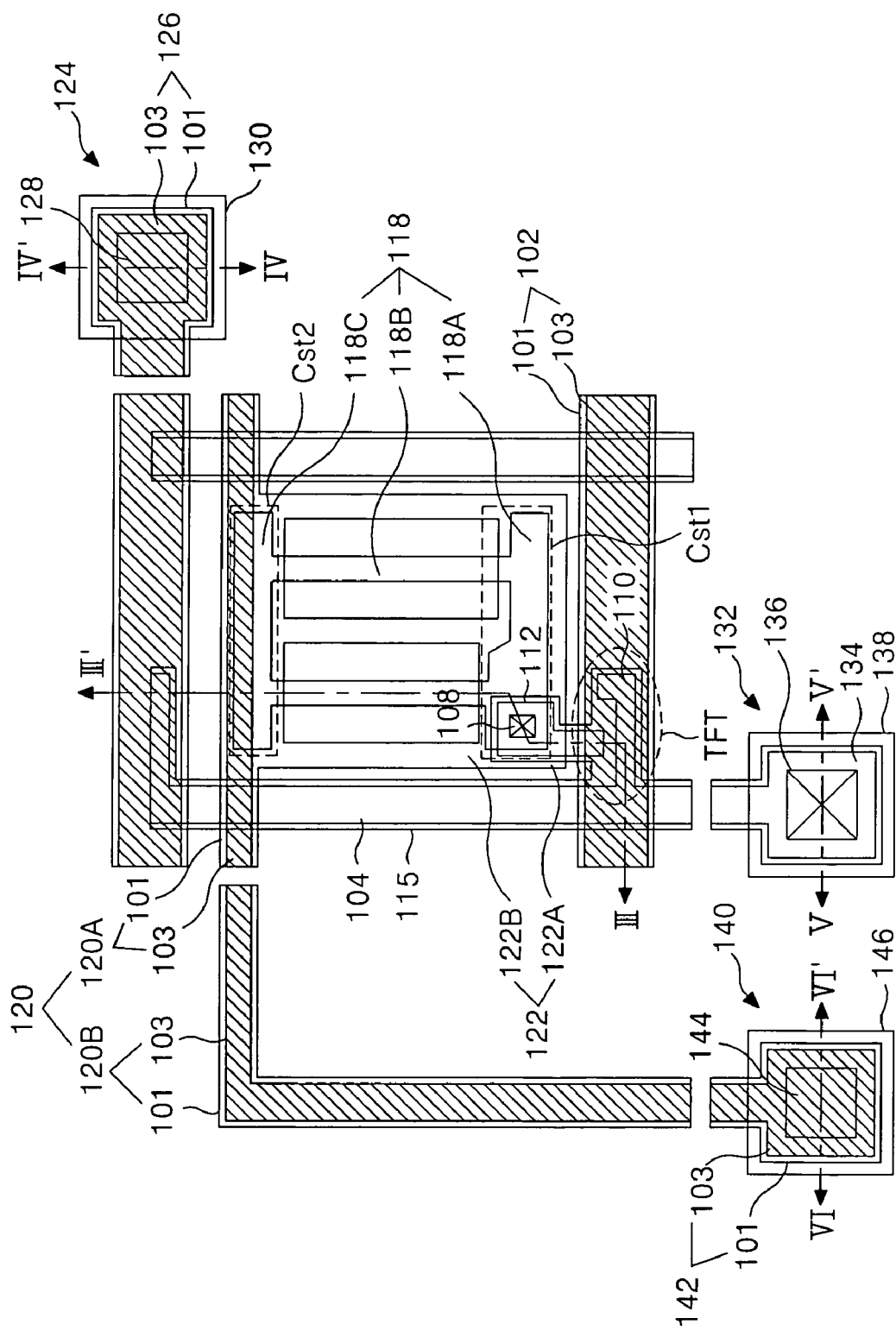
FIG. 4 is plan view illustrating a horizontal electric field applying type thin film transistor according to an embodiment of the present invention.
Figure 5:
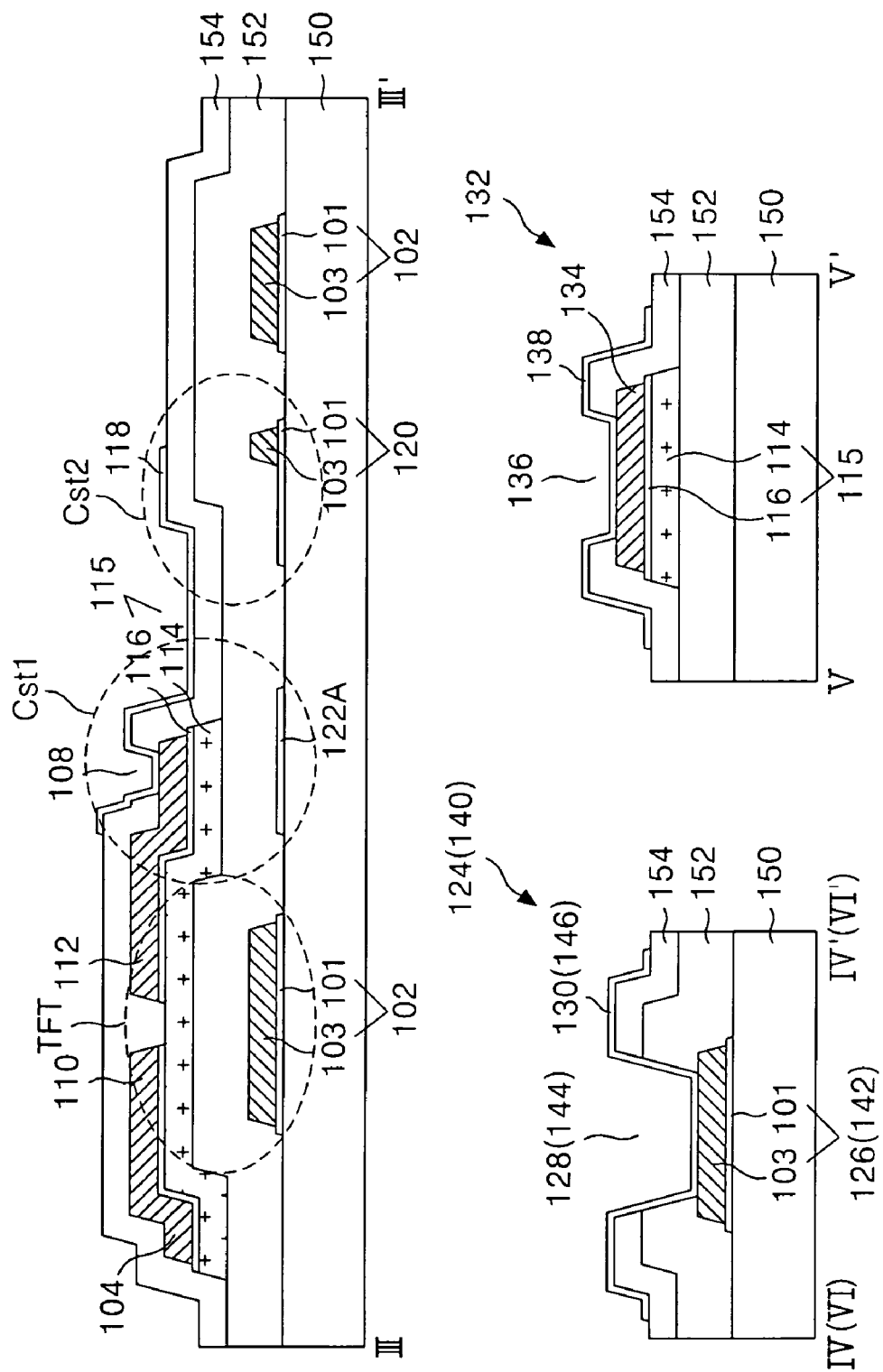
FIG. 5 is a sectional diagram illustrating the thin film transistor substrate shown in FIG. 4, taken along the lines III-III', IV-IV', V-V', VI-VI'.

FIG. 4 is a plan view illustrating a horizontal electric field applying type thin film transistor substrate according to an embodiment of the present invention, and FIG. 5 is a sectional diagram illustrating the thin film transistor substrate shown in FIG. 4, taken along the lines III-III', IV-IV', V-V', and VI-VI'.

The thin film transistor substrate shown in FIGS. 4 and 5 includes a gate line 102 and a data line 104 which cross each other with a gate insulating film 152 therebetween on a lower substrate to define a pixel area; a thin film transistor TFT connected to the gate line 102, the data line 104 and a pixel electrode 118; a common electrode 122 and a pixel electrode 118 arranged to form a horizontal electric field in a pixel area; and a common line 120 connected to the common electrode 122. And, the thin film transistor substrate further includes first and second capacitors Cst1, Cst2 respectively formed at an overlapping part of the common electrode 122 and the pixel electrode 118 and an overlapping part of the common line 120 and the pixel electrode 118; a gate pad 124 connected to the gate line 102; a data pad 132 connected to the data line 104; and a common pad 140 connected to the common line 120.

The gate line 102 supplies a scan signal from a gate driver (not shown) and the data line 104 supplies a video signal from a data driver (not shown). The gate line 102 and the data line 104 cross each other with the gate insulating film 152 therebetween to define each pixel area. Herein, the gate line 102 may be formed in a double structure in which a first conductive layer 101 of transparent conductive layer and a second conductive layer 103 of opaque metal are formed.

The thin film transistor TFT has a video signal on the data line 104 charged in the pixel electrode 118 and kept there in response to a scan signal of the gate line 102. For this, the thin film transistor TFT includes a gate electrode which is included in the gate line 102; a source electrode 110 connected to the data line 104; a drain electrode 112 which is opposite to the source electrode 110 and is connected to the pixel electrode 118; an active layer 114 which overlaps the gate line 102 with the gate insulating film 152 therebetween to form a channel between the source electrode 110 and the drain electrode 112; and an ohmic contact layer 116 formed on the active layer 114 except for the channel part for being in ohmic contact with the source electrode 110 and the drain electrode 112.

A semiconductor pattern 115 having the active layer 114 and the ohmic contact layer 116 is formed to overlap the data line 104 and a data pad lower electrode 134.

The common line 120 and the common electrode 122 supply a reference voltage for driving liquid crystal, i.e., common voltage, to each pixel.

For this, the common line 120 includes an internal common line 120A formed parallel to the gate line 102 in a display area; and an external common line 120B commonly connected to the internal common line 120A in a non-display area. The common line 120 may be formed in a double structure such that first and second conductive layers 101, 103 are formed similar to the gate line 102.

The common electrode 122 is connected to the internal common line 120A in each pixel area. Specifically, the common electrode 122 includes a finger part 122B extended from the first conductive layer 101 of the internal common line 120A to the pixel area; and a horizontal part 122A connected to the finger part 122B. The common electrode 122 is formed of the transparent conductive layer like the first conductive layer 101 of the common line 120.

The pixel electrode 118 is connected to the drain electrode 112 of the thin film transistor TFT, and is arranged to form the horizontal electric field with the common electrode 118 in each pixel area. Specifically, the pixel electrode 118 includes a first horizontal part 118A which is formed parallel to the gate line 102 to be connected to the drain electrode 112 that is exposed through the first contact hole 108; a second horizontal part 118C formed to overlap the internal common line 120A; and a finger part 118B formed parallel to the finger part 122B of the common electrode to be connected between the first and second horizontal parts 118A, 118C. If a video signal is supplied to the pixel electrode 118 through the thin film transistor TFT, a horizontal electric field is formed between the finger part 118B of the pixel electrode 118 and the finger part 122B of the common electrode 122 to which a common voltage is supplied through the common line 120. The liquid crystal molecules, which are arranged in a horizontal direction between the thin film transistor substrate and the color filter substrate by such a horizontal electric field, rotate by dielectric anisotropy. And, the transmittance of the light transmitted through the pixel area is changed in accordance with the extent of rotation of the liquid crystal molecules, thereby realizing the gray level.

The storage capacitor includes a first storage capacitor Cst1 formed for the first horizontal part 118A of the pixel electrode 118 to overlap the horizontal part 122A of the common electrode 122 with the passivation film 154 and the gate insulating film 152 therebetween; and a second storage capacitor Cst2 formed of the second horizontal part 118C of the pixel electrode 118 to overlap the internal common line 120A with the passivation film 154 and the gate insulating film 152 therebetween. Herein, the line width of the part which is to overlap the pixel electrode 118 is made to be relatively greater in the first conductive layer 101 of the common line 120 to increase the overlapping area with the pixel electrode 118, thereby enabling an increase in the capacity of the second storage capacitor Cst2 without reducing the aperture ratio. Further, the first and second storage capacitors Cst1, Cst2 are connected to the pixel electrode 118 in parallel by sharing the common electrode 122 or the common line 120, thus the capacity of the storage capacitor may be further increased. Herein, it is possible to have one of the first and second storage capacitors Cst1, Cst2 as the storage capacitor.

The storage capacitor allows the pixel signal charged in the pixel electrode 118 to remain stable until the next pixel signal is charged.

The gate line 102 is connected to a gate driver (not shown) through the gate pad 124. The gate pad 124 includes a gate pad lower electrode 126 extended from the gate line 102; a gate pad upper electrode 130 connected to the gate pad lower electrode 126 which is exposed through a second contact hole 128 penetrating the gate insulating film 152 and the passivation film 154. Herein, the gate pad lower electrode 126 has a double structure wherein the first and second conductive layers 101, 103 are formed, similar to the gate line 102.

The data line 104 is connected to a data driver (not shown) through the data pad 132. The data pad 132 includes a data pad lower electrode 134 extended from the data line 104 together with the semiconductor pattern 115 thereunder; and a data pad upper electrode 138 connected to the data pad lower electrode 134 which is exposed through the third contact hole 136 penetrating the passivation film 154.

The common line 120 receives reference voltage from a common voltage source (not shown) through the common pad 140. The common pad 140 includes a common pad lower electrode 142 extended from the external common line 120B; and a common pad upper electrode 146 connected to the common pad lower electrode 142 which is exposed through a fourth contact hole 144 penetrating the gate insulating film 152 and the passivation film 154. Herein, the common pad lower electrode 142 has a double structure wherein the first and second conductive layers 101, 103 are formed, similar to the common line 120.

In the horizontal electric field applying type thin film transistor substrate according to the embodiment of the present invention, the common electrode 122 may be formed of the first conductive layer being the transparent conductive layer, thus it is possible to prevent the deterioration of aperture ratio caused thereby. Further, the common line 120 may be formed in the double structure such that the first and second conductive layers 101, 103 are formed. Thus, line resistance can be reduced. And, the storage capacitor is configured by having the first and second storage capacitors Cst1, Cst2 connected in parallel. Thus, the capacity can be increased without reducing the aperture ratio.

The thin film transistor substrate according to the present invention having such an advantage is formed by the following four mask processes.

FIGS. 6A and 6B are a plan view and a sectional diagram for explaining a first mask process in a fabricating method of a transflective thin film transistor substrate according to an embodiment of the present invention, and FIGS. 7A to 7E illustrate sectional diagrams specifically explaining the first mask process.

By the first mask process, there is formed on the lower substrate 150 a gate pattern having the gate line 102 and the gate pad lower electrode 126; and a common pattern having the common line 120, the common electrode 122 and the common pad lower electrode 142. Herein, the gate pattern, the common line and pad 120, 142 are formed in the double structure that the first and second conductive layers 101, 103 are formed, and the common electrode 122 and part of the internal common line 120A are formed in a single layer structure to be extended from the first conductive layer 101 of the common line 120. The gate and common patterns having the double and single layer structure are formed by one mask process using a halftone mask or a diffractive exposure mask. Hereinafter, the case that the halftone mask is used as a first mask is taken as an example for explanation.

Figure 7B:
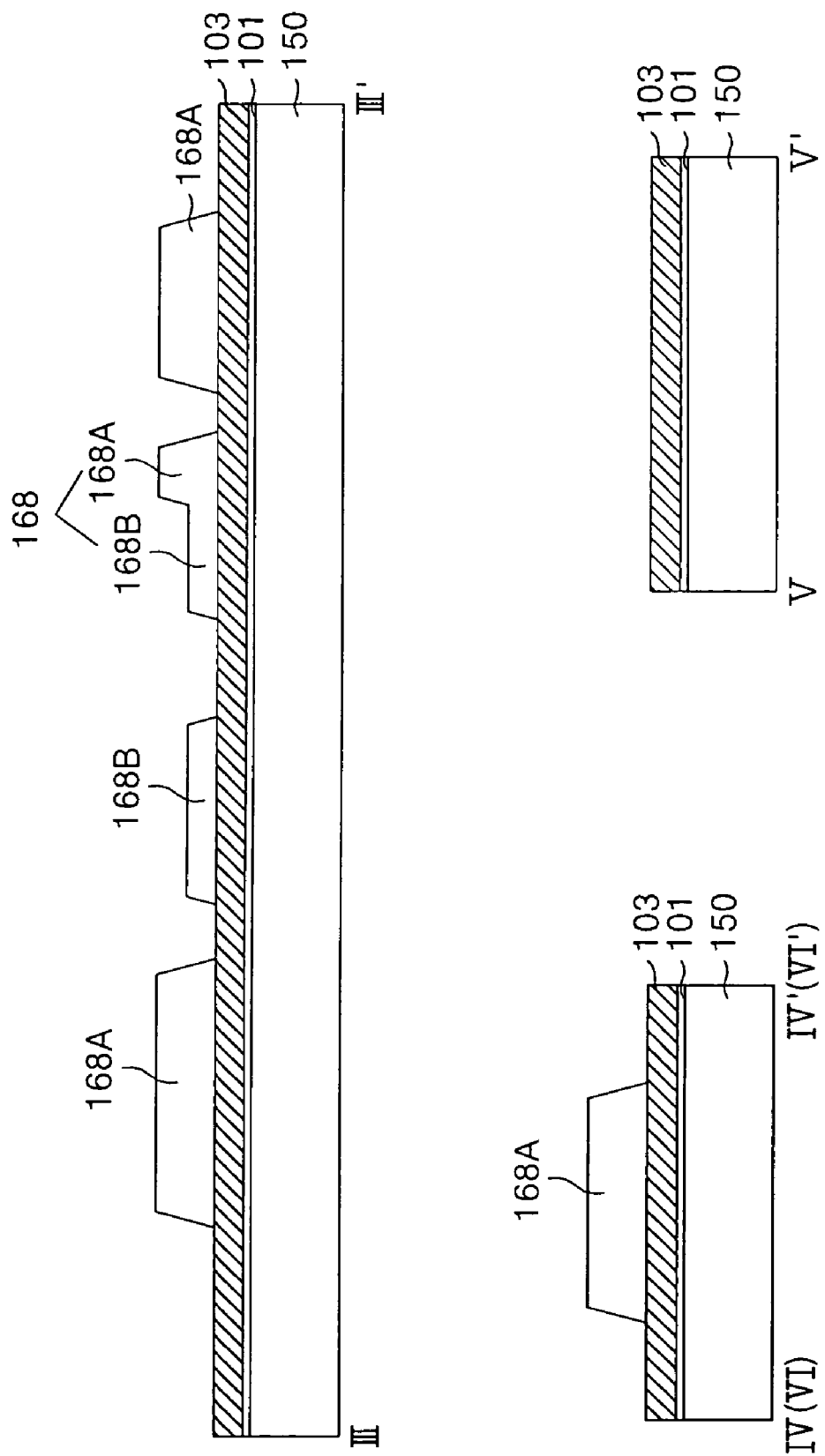

Specifically, as shown in FIG. 7A, the first and second conductive layers 101, 103 are formed on the lower substrate 150 by a deposition method such as sputtering, and a photo-resist 167 is formed thereon. The first conductive layer 101 is formed of a transparent conductive material such as ITO, TO, IZO, and the second conductive layer is formed of a metal material such as Mo, Ti, Cu, AlNd, Al, Cr, Mo W system. And then, the photo-resist 167 is exposed and developed by the photolithography process using the halftone mask 160, thereby forming a photo-resist pattern 168 having a stepped difference, as shown in FIG. 7B.

The halftone mask 160, as shown in FIG. 7A, includes a transparent quartz SiO2 substrate 166, and a partial transmission layer 164 and a shielding layer 162 formed thereon. The shielding layer 162 overlapping the partial transmission layer 164 is located in an area where the gate pattern is to be formed, to shield ultraviolet ray UV, thereby having a first photo-resist pattern 168A remain after development, as shown in FIG. 7B.

The partial transmission layer 164 which does not overlap the shielding layer 162 is located in an area where the common electrode 122 and part of the internal common line 120A are to be formed, to partially transmit the ultraviolet ray UV, thereby having a second photo-resist pattern 168B remain after development, as shown in FIG. 7B, wherein the second photo-resist pattern 168B is thinner than the first photo-resist pattern 168A. For this, the shielding layer 162 is formed of metal such as Cr, CrOx, and the partial transmission layer 164 is formed of MoSix.

Subsequently, the first and second conductive layers 101, 103 are patterned by the etching process using the photo-resist pattern 168 with a stepped difference, thereby forming the common electrode 122, and the gate pattern, the common line 120 and the common pad 142 which have the double layer structure, as shown in FIG. 7C.

And then, the photo-resist pattern 168 is ashed by an ashing process using oxygen plasma. Thus, the first photo-resist pattern 168A becomes thin and the second photo-resist pattern 168B is removed, as shown in FIG. 7D. And, the second conductive layer 103 on the common electrode 122 and the part of the internal common line 120A is removed by the etching process using the ashed first photo-resist pattern 168A. At this moment, both side parts of the second conductive layer 103 patterned along the ashed photo-resist pattern 168A are etched once more, thus the first and second conductive layers 101, 103 of the gate pattern, the common line 120 and the common pad 142 have a uniform stepped difference in a step shape. Accordingly, in a case in which the side surface part of the first and second conductive layers 101, 103 have a steep slope, the short defect of the source/drain metal layer which can be generated thereon can be prevented.

And, the first photo-resist pattern 168A remaining on the gate pattern is removed by the stripping process, as shown in FIG. 7E, thereby completing the gate and common pattern having the double and single layer structure.

Figure 8A:
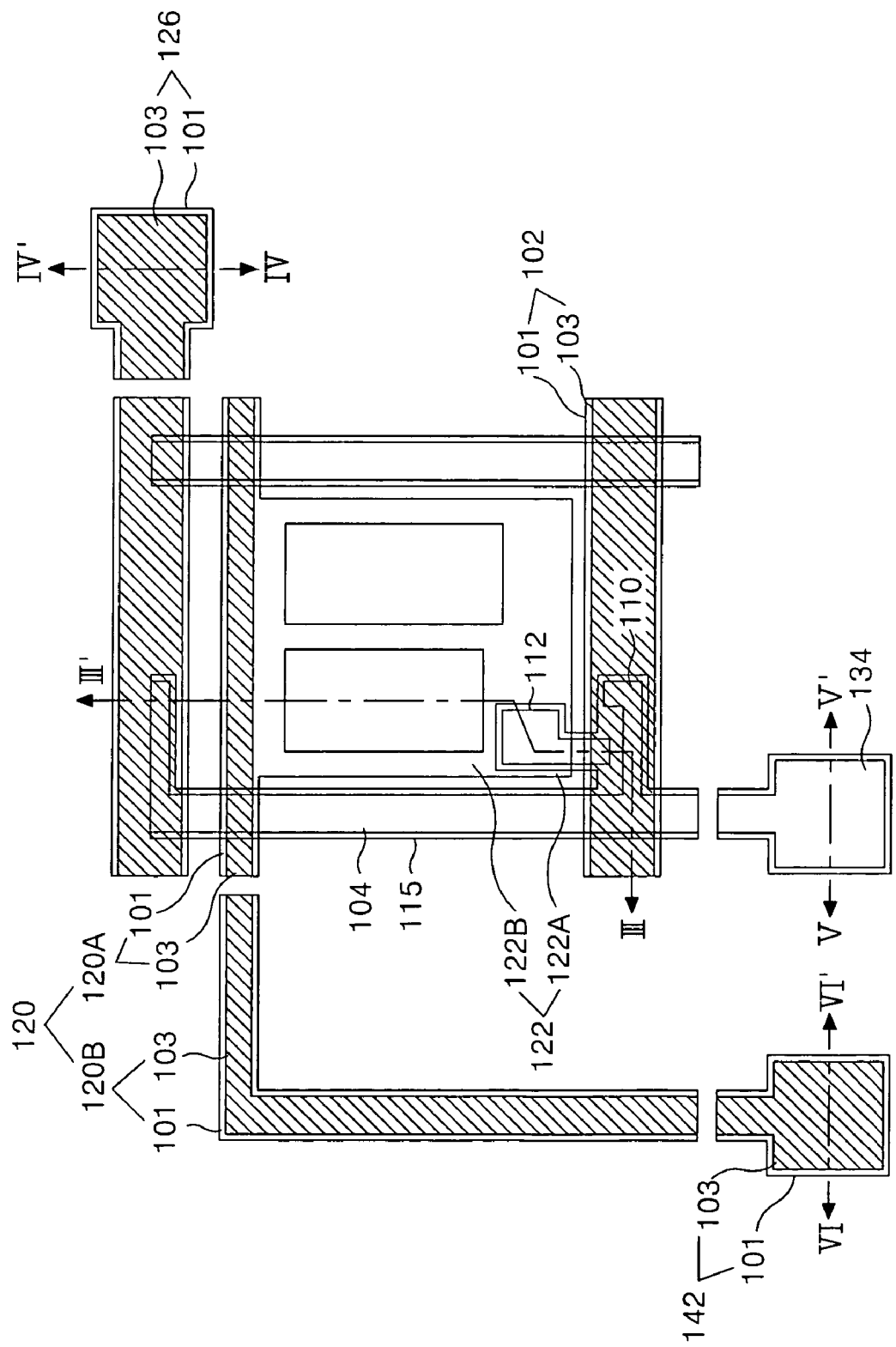

FIGS. 8A and 8B illustrate a plan view and a sectional diagram explaining a second mask process in a fabricating method of the thin film transistor substrate according to the embodiment of the present invention, and FIGS. 9A to 9E illustrate sectional diagrams specifically explaining the second mask process.

The gate insulating film 152 is formed on the lower substrate 150 where the gate pattern is formed. And, there is formed by the second mask process thereon the source/drain pattern inclusive of the data line 104, the source electrode 110, the drain electrode 112, the data pad lower electrode 134, and the semiconductor pattern 115 inclusive of the active layer 114 and the ohmic contact layer 116. The semiconductor pattern 115 and the source/drain pattern are formed by one mask process using the diffractive exposure mask or the halftone mask. Hereinafter, the case of using the diffractive exposure mask as the second mask will be explained.

Specifically, as shown in FIG. 9A, there are sequentially formed the gate insulating film 152, an amorphous silicon layer 105, an amorphous silicon layer 107 doped with impurities (n+ or p+) and a source/drain metal layer 109 on the lower substrate 150 where the gate pattern is formed. For example, the gate insulating film 152, the amorphous silicon layer 105 and the amorphous silicon layer 107 doped with impurities (n+ or p+) are formed by a PECVD method, and the source/drain metal layer 109 is formed by a sputtering method. The gate insulating film 152 is formed of an inorganic insulating material such as SiOx, SiNx. The source/drain metal layer 109 is formed of Cr, Mo, Mo W, Al/Cr, Cu, Al(Nd), Al/(Mo), Al(Nd)/Al, Al(Nd)/Cr, Mo/Al (Nd)/Mo, Cu/Mo or Ti/Al(Nd)/Ti. After the photo-resist 180 is formed over the source/drain metal layer 109, the photo-resist 180 is exposed and developed by the photolithography process using the diffractive exposure mask 170, thereby forming a photo-resist pattern 182 having the stepped difference, as shown in FIG. 9B.

The diffractive exposure mask 170, as shown in FIG. 9A, includes a quartz substrate 172, and a shielding layer 174 and a diffractive exposure slit 176 which are formed of a metal layer such as Cr thereon. The shielding layer 174 is located at an area, where the semiconductor pattern and the source/drain pattern are to be formed, to shield ultraviolet ray, thereby having a first photo-resist pattern 182A remain after development, as shown in FIG. 9B. The diffractive exposure slit 176 is located at an area, where the channel of the thin film transistor is to be formed, to diffract the ultraviolet ray, thereby having a second photo-resist pattern 182B remain after development, as shown in FIG. 9B, wherein the second photo-resist pattern 182B is thinner than the first photo-resist pattern 182A.

Subsequently, the source/drain metal layer 109 is patterned by the etching process using the photo-resist pattern 182 with the stepped difference, thereby forming the source/drain pattern and the semiconductor pattern 115 thereunder, as shown in FIG. 9C. In this case, the source electrode 110 and the drain electrode 112 in the source/drain pattern have an integrated structure.

And then, the photo-resist pattern 182 is ashed by the ashing process using oxygen $O_2$ plasma. Thus, the first photo-resist pattern 182A becomes thin and the second photo-resist pattern 182B is removed, as shown in FIG. 9D. And, the source/drain pattern exposed by removing of the second photo-resist pattern 182B and the ohmic contact layer 116 thereunder are removed by the etching process using the ashed first photo-resist pattern 182A, thereby separating the source electrode 110 and the drain electrode 112 and exposing the active layer 114. Accordingly, there is formed a channel of the active layer 114 between the source electrode 110 and the drain electrode 112. At this moment, both side parts of the source/drain pattern are etched once more along the ashed first photo-resist pattern 182A, thus the source/drain pattern and the semiconductor pattern 115 have a uniform stepped difference in a step shape.

And, the first photo-resist pattern 182A remaining on the source/drain pattern is removed by the stripping process, as shown in FIG. 9E, thereby completing the semiconductor pattern 115 and the source/drain pattern.

FIGS. 10A and 10B are a plan view and a sectional diagram explaining a third mask process in the fabricating method of the thin film transistor substrate according to the embodiment of the present invention.

By the third mask process, there is formed the passivation film 154 having the first to fourth contact holes 108, 128, 136, 144 by a method such as PECVD, spin coating, spinless coating on the gate insulating film 152 where the source/drain pattern is formed.

Specifically, the passivation film 154 is formed by a method such as PECVD, spin coating, spinless coating on the gate insulating film 152 where the source/drain pattern is formed. The passivation film 154 is formed of an organic insulating material or an inorganic insulating material like the gate insulating film 152. And, the passivation film 154 and the gate insulating film 152 are patterned by the photolithography process and the etching process using the third mask on the passivation film 154, thereby forming the first to fourth contact holes 108, 128, 136, 144. Herein, the first and third contact holes 108, 136 respectively expose the drain electrode 112 and the data pad lower electrode 134 by penetrating the passivation film 154. The second and fourth contact holes 128, 144 respectively expose the gate pad lower electrode 126 and the common pad lower electrode 142 by penetrating the passivation film 154 and the gate insulating 152.

FIGS. 11A and 11B are a plan view and a sectional diagram for explaining a fourth mask process in the fabricating method of the thin film transistor substrate according to an embodiment of the present invention.

By the fourth mask process, there is formed the transparent conductive pattern inclusive of the pixel electrode 118, the gate pad upper electrode 130, the data pad upper electrode 138 and the common pad upper electrode 146.

Specifically, the transparent conductive layer is formed on the passivation film 154 by a deposition method such as sputtering. The transparent conductive layer is formed of ITO, TO or IZO like the first conductive layer 101 of the gate and common pattern. Further, the transparent conductive layer can be replaced with an opaque metal, such as Ti, W, which has high corrosion resistance and high strength. And then, the transparent conductive layer is patterned by the photolithography process and the etching process using the fourth mask, thereby forming the transparent conductive pattern having the pixel electrode 118, the gate pad upper electrode 130, the data pad upper electrode 138 and the common pad upper electrode 146. Accordingly, the pixel electrode 118, the gate pad upper electrode 130, the data pad upper electrode 138 and the common pad upper electrode 146 respectively connected to the drain electrode 112, the gate pad lower electrode 126, the data pad lower electrode 134 and the common pad lower electrode 142 through the first to fourth contact holes 108, 128, 136, 144. For example, each of the pixel electrode 118, the gate pad upper electrode 130, the data pad upper electrode 138 and the common pad upper electrode 146 is in contact with the surface of each of the drain electrode 112, the gate pad lower electrode 126, the data pad lower electrode 134 and the common pad lower electrode 142.

Figure 12:
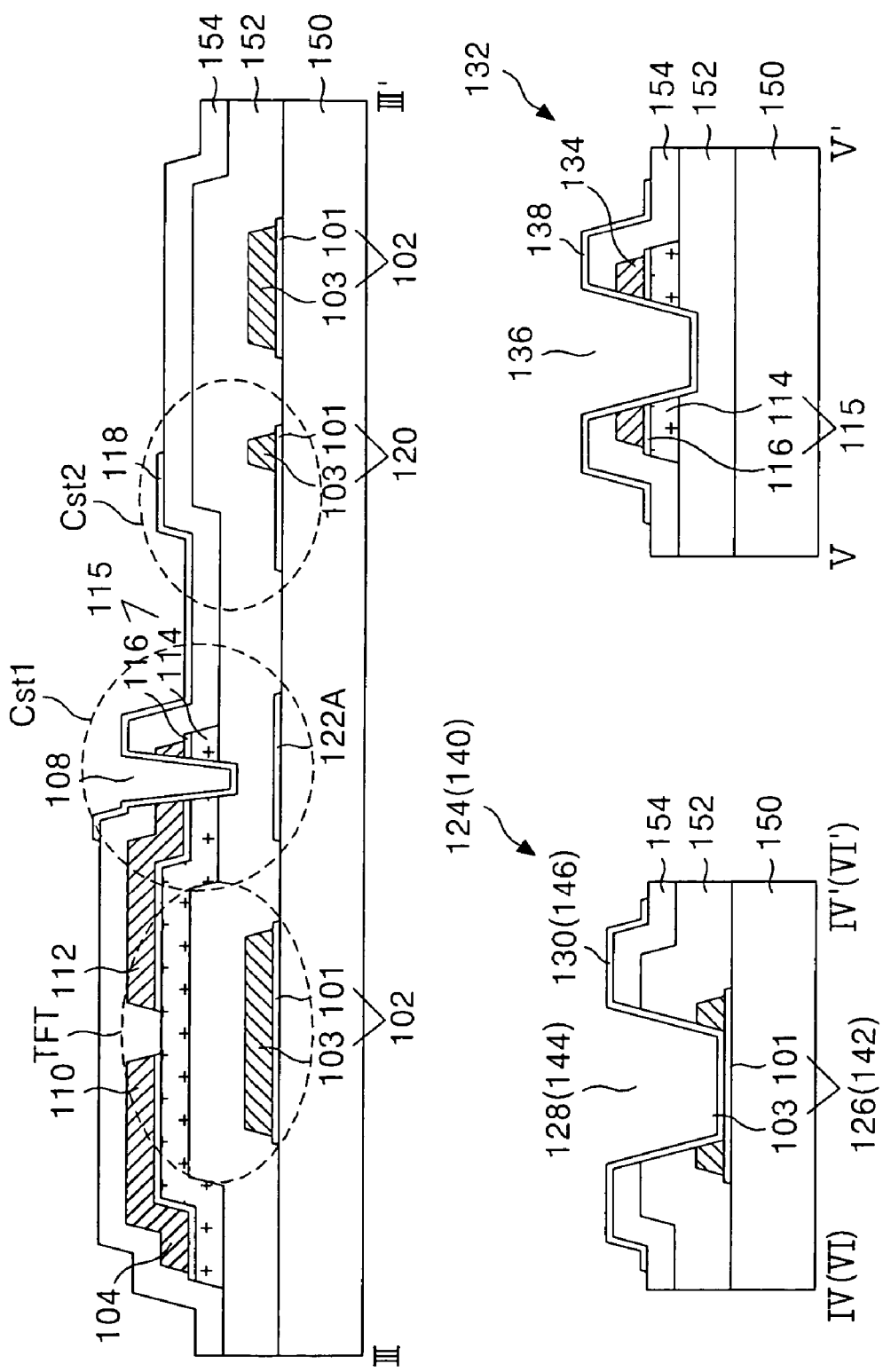
FIG. 12 is a sectional diagram illustrating a horizontal electric field applying type thin film transistor substrate according to another embodiment of the present invention.

On the other hand, in a case in which the second conductive layer 103 of the gate pattern and the common pattern and the source/drain pattern are formed of a metal like Mo, with which the dry etching is performed with ease, as shown in FIG. 12, each of the pixel electrode 118, the gate pad upper electrode 130, the data pad upper electrode 138 and the common pad upper electrode 146 is in contact with the side surface of each of the drain electrode 112, the gate pad lower electrode 126, the data pad lower electrode 134 and the common pad lower electrode 142. This is because the second and fourth contact holes 128, 144 penetrate the second conductive layer 130 of the gate pad lower electrode 126 and the common pad lower electrode 142 and the first and fourth contact holes 108, 136 penetrate the drain electrode 112 and the data pad lower electrode 134 in case that the passivation film 154 and the gate insulating film 152 are patterned by the third mask process. Particularly, the first and third contact holes 108, 136 penetrate to the semiconductor pattern 115 under the drain electrode 112 and the data pad lower electrode 134, or are extended to the part of the gate insulating film 152.

Figure 13:
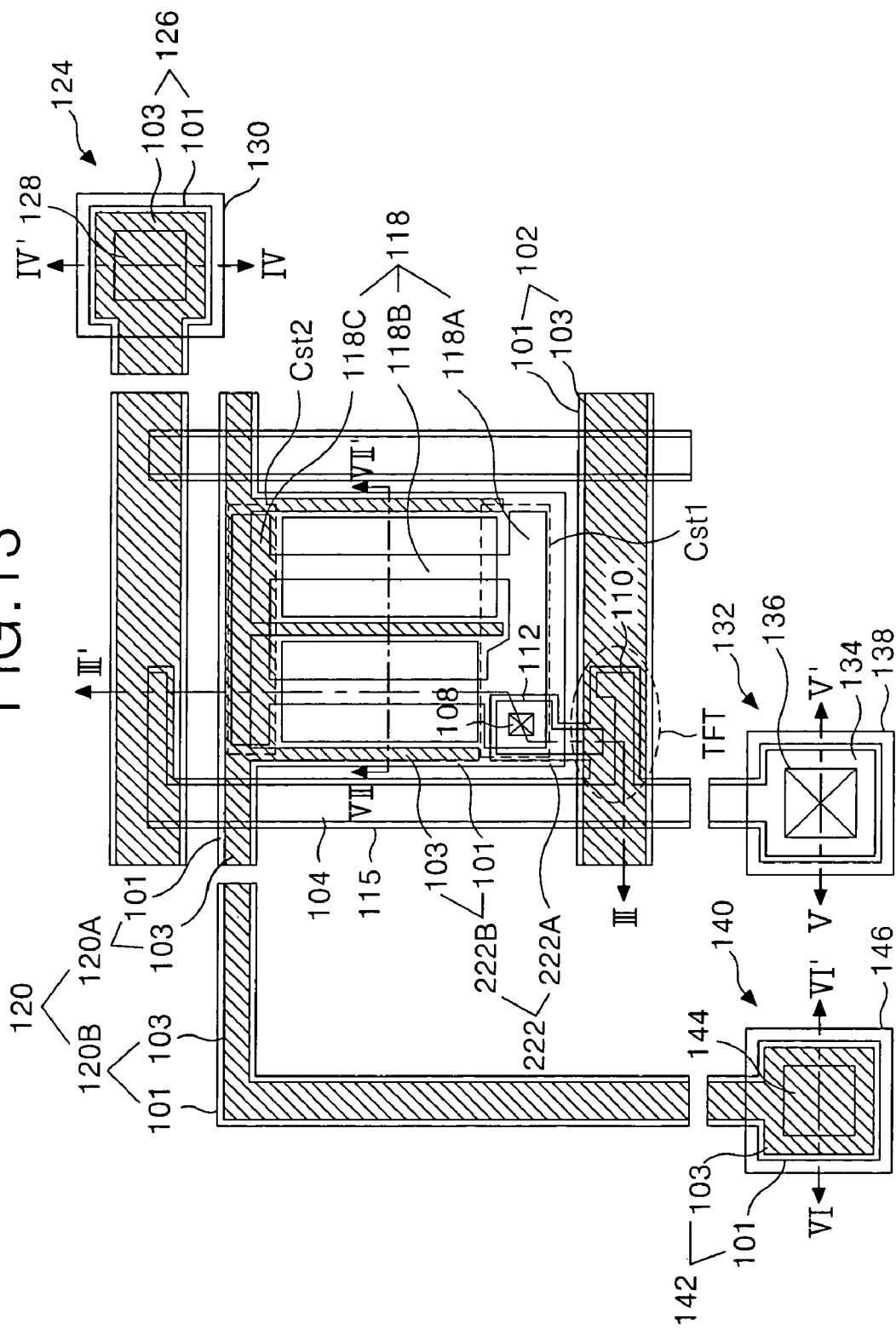
FIG. 13 is a sectional diagram illustrating a horizontal electric field applying type thin film transistor substrate according to still another embodiment of the present invention.
Figure 14:
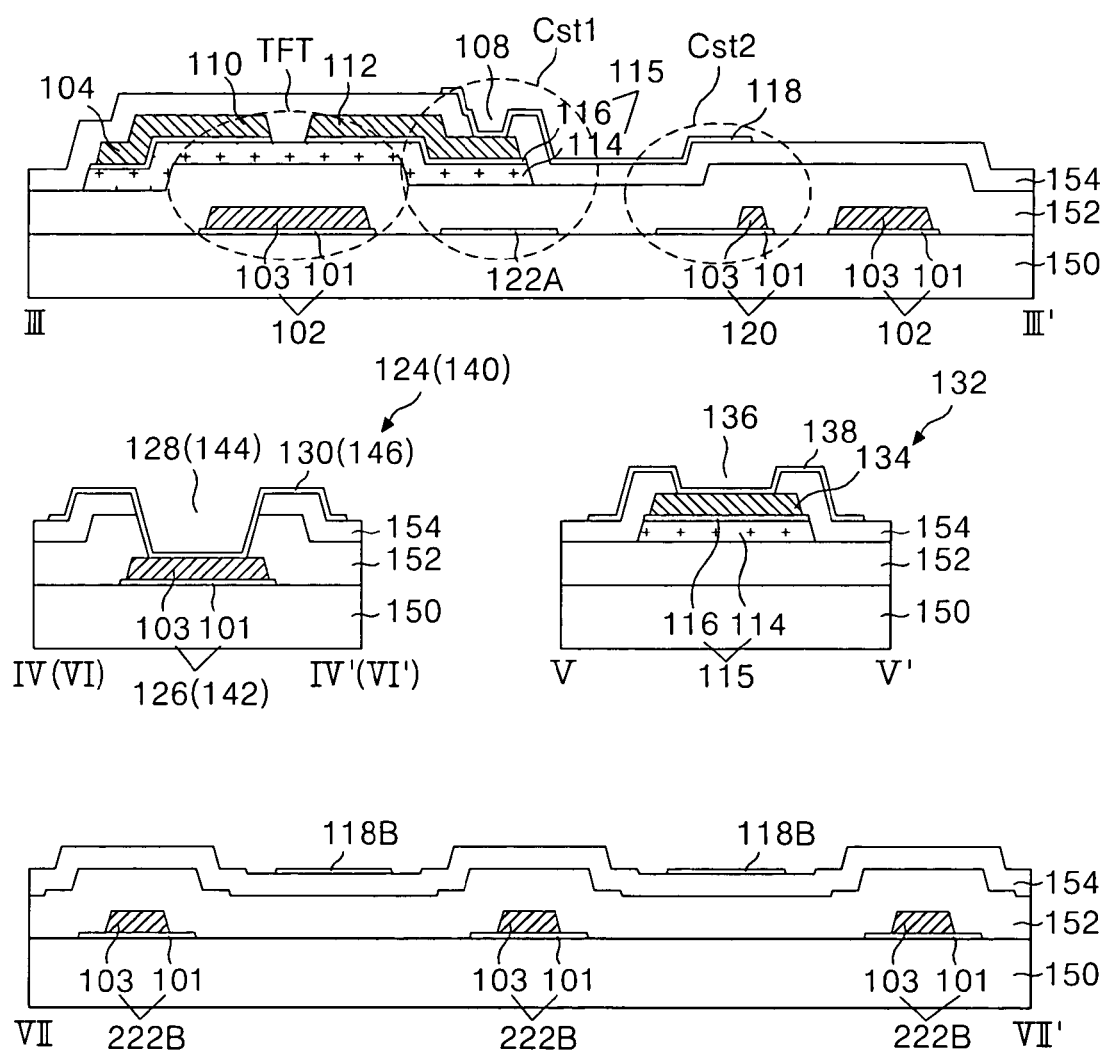
FIG. 14 is a sectional diagram illustrating the thin film transistor substrate shown in FIG. 13, taken along the lines III-III', IV-IV', V-V', VI-VI', VII-VII'.

FIG. 13 is a plan view illustrating a horizontal electric field applying type thin film transistor substrate according to another embodiment of the present invention, and FIG. 14 is a sectional diagram illustrating the thin film transistor substrate shown in FIG. 13, taken along the lines III-III', IV-IV', V-V', VI-VI', and VII-VII'.

The thin film transistor substrate shown in FIGS. 13 and 14 includes the same components as the thin film transistor substrate shown in FIGS. 4 and 5 except that the common electrode 222 is formed in the double structure that the first and second conductive layers 101, 103 are deposited, like the common line 120. Accordingly, the description on the repeated components will be omitted.

The common electrode includes a finger part 222B which is connected to the internal common line 120A and has a double structure that a transparent first conductive layer 101 and an opaque second conductive layer are deposited; and a horizontal part 222A which is connected to the finger part 222B and has a single layer structure formed of only the first conductive layer 101. Herein, the second conductive layer 103 of the finger part 222B plays the role of a shielding layer of light leakage caused by the first conductive layer 101. At this moment, the second conductive layer 103 of the finger part 222B has a line width narrower than the first conductive layer 101 so as not to interfere both side parts of the first conductive layer 101 which contributes to the aperture ratio. For example, the corresponding both side parts of the first conductive layer 101 from the edge of the finger part 222B to about 1 μm inward contributes to the aperture ratio. Thus, the second conductive layer 103 is formed to overlap the remaining part except the both side parts of the first conductive layer 101. Accordingly, the finger part 222B of the common electrode 222 improves the aperture ratio by the first conductive layer 101 and the light leakage is prevented by the second conductive layer 103, thereby enabling to improve contrast.

The finger part 222B of the common electrode having the double structure and the horizontal part 222A having the single layer structure, as described in FIGS. 6A to 7E, are formed by one mask process using the halftone mask or diffractive exposure mask. In this case, in the finger part 222B, the overlapping part of the first and second conductive layers 101, 103 is formed to correspond to the shielding part of the halftone mask (or diffractive exposure mask) and both side parts of the first conductive layer 101, which does not overlap the second conductive layer 103, are formed in correspondence to the partial transmission part (or diffractive exposure part).

As described above, the horizontal electric field applying type thin film transistor substrate and the fabricating method thereof according to the present invention forms the common electrode of transparent first conductive layer by the same mask process as other common pattern and the gate pattern of the double structure having the first conductive layer. Accordingly, the overall process can be simplified to the four mask processes and the aperture ratio can also be improved. Further, the storage capacitor includes the first and second storage capacitors connected in parallel. Thus, the capacity can be increased without reducing the aperture ratio.

Further, in the horizontal electric field applying type thin film transistor substrate and the fabricating method thereof according to the present invention, the finger part of the common electrode further includes the opaque second conductive layer which overlaps the transparent first conductive layer with its line width narrower than the first conductive layer. Thus, the aperture ratio is improved on both side parts of the first conductive layer, which does not overlap the second conductive layer and the contrast can be improved by preventing the light leakage by the second conductive layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a liquid crystal display device, comprising:
    forming a gate pattern having a double layered structure including a transparent first conductive layer and an opaque second conductive layer on a substrate, and a common pattern having a common line of the double layered structure and a common electrode formed of the first conductive layer using a first mask;
    forming a gate insulating film on the gate pattern and the common pattern;
    forming a semiconductor pattern on the gate insulating film, and a source/drain pattern having a data line, a source electrode and a drain electrode on the semiconductor pattern using a second mask;
    forming a passivation film on the source/drain pattern, and a contact hole exposing the drain electrode using a third mask; and
    forming a pixel electrode connected to the drain electrode through the contact hole using a fourth mask, wherein a horizontal field is formed with the common electrode, wherein a line width of the first conductive layer of the common line is wider than a portion of the common line overlapped by the pixel electrode.

2. The method according to claim 1, further comprising:
    forming a storage capacitor by an overlapping part of the pixel electrode and the common electrode, the gate insulating film and the passivation film therebetween.

3. The method according to claim 1, further comprising:
    forming a storage capacitor by an overlapping part of the pixel electrode and the common line, the gate insulating film and the passivation film therebetween.

4. The method according to claim 1, further comprising:
    forming a first storage capacitor overlapping a part of the pixel electrode and the common electrode with the gate insulating film and the passivation film therebetween; and
    forming a second storage capacitor overlapping another part of the pixel electrode and a part of the common line, wherein the gate insulating film and the passivation film are therebetween.

5. The method according to claim 1, further comprising:
    forming a light shielding layer overlapping the common electrode using the second conductive layer.

6. The method according to claim 5, wherein the light shielding layer is formed to have a line width so as to expose both side parts of the common electrode.

7. The method according to claim 1, further comprising:
    forming a gate pad lower electrode having a double layered structure;
    forming an another contact hole penetrating the gate insulating film and the passivation film; and
    forming a gate pad upper electrode connected to the gate pad lower electrode through the another contact hole.

8. The method according to claim 7, wherein the contact hole is extended to penetrate to a second conductive layer of the gate pad lower electrode.

9. The method according to claim 1, further comprising:
    forming a common pad lower electrode having a double layered structure;
    forming an another contact hole penetrating the gate insulating film and the passivation film; and
    forming a common pad upper electrode connected to the common pad lower electrode through the another contact hole.

10. The method according to claim 9, wherein the contact hole is extended to penetrate to a second conductive layer of the common pad lower electrode.

11. The method according to claim 1, further comprising:
    forming a data pad lower electrode;
    forming an another contact hole penetrating the passivation film; and
    forming a data pad upper electrode connected to the data pad lower electrode through the another contact hole.

12. The method according to claim 1, wherein the gate line and the common line are formed of the first and second conductive layers and have a stepped difference.

13. The method according to claim 1, wherein the pixel electrode is formed of one of a transparent conductive layer, titanium and tungsten.

14. The method according to claim 1, wherein forming the gate pattern and the common pattern includes:
- forming the first and second conductive layers on the substrate;
- forming first and second photo-resist patterns having a different thickness on the second conductive layer using a photolithography process including one of a halftone mask and diffractive exposure mask;
- forming the gate pattern and the common line of the double layered structure, and the common electrode where the second conductive layer remains, by patterning the first and second conductive layers using an etching process including the first and second photo-resist patterns;
- forming the first photo-resist pattern thin and removing the second photo-resist pattern using an ashing process;
- removing a second conductive layer on the common electrode using an etching process using the ashed first photo-resist pattern; and
- removing the ashed first photo-resist pattern.

* * * * *